United States Patent [19]
Hashimoto et al.

[11] Patent Number: 5,878,173
[45] Date of Patent: Mar. 2, 1999

[54] PIPELINE IMAGE PROCESSING METHOD AND DEVICE FOR COMPUTING IMAGE BLOCK ON HALF-GRID

[75] Inventors: Masashi Hashimoto; Hirohisa Yamaguchi, both of Tsukuba, Japan

[73] Assignee: Texas Instruments Incorporated, Dallas, Tex.

[21] Appl. No.: 730,993

[22] Filed: Oct. 16, 1996

Related U.S. Application Data

[63] Continuation of Ser. No. 119,931, Sep. 10, 1993, abandoned.

[30] Foreign Application Priority Data

Sep. 10, 1992 [JP] Japan .................................. 4-269582

[51] Int. Cl.$^6$ ................. G06T 1/20; G06T 1/60
[52] U.S. Cl. ................. 382/282; 382/300; 382/303; 348/714
[58] Field of Search ................. 382/303, 299, 382/300, 205, 282, 284; 348/714, 716; 345/121, 123, 118, 434, 508, 511

[56] References Cited

U.S. PATENT DOCUMENTS

| | | | |
|---|---|---|---|
| 4,174,514 | 11/1979 | Sternberg | 382/303 |
| 4,524,455 | 6/1985 | Holsztynski et al. | 382/303 |
| 4,633,503 | 12/1986 | Hinman | 382/299 |
| 4,758,881 | 7/1988 | Laspada | 348/560 |
| 4,776,025 | 10/1988 | Hosoda | 382/260 |
| 4,790,025 | 12/1988 | Inoue et al. | 382/293 |
| 4,797,945 | 1/1989 | Suzuki et al. | 382/253 |
| 4,815,010 | 3/1989 | O'Donnell | 395/166 |
| 5,125,048 | 6/1992 | Virtue et al. | 382/205 |
| 5,247,355 | 9/1993 | Frederiksen | 348/416 |
| 5,311,310 | 5/1994 | Jozawa et al. | 348/416 |
| 5,398,079 | 3/1995 | Liu et al. | 348/699 |
| 5,402,513 | 3/1995 | Schafer | 382/298 |

FOREIGN PATENT DOCUMENTS

| | | | |
|---|---|---|---|
| 0 085 210 A | 8/1983 | European Pat. Off. | G06F 15/20 |
| 2 092 785 | 8/1982 | United Kingdom | G06F 13/00 |

OTHER PUBLICATIONS

Bellifemine et al, "Subpixel Accuracy in Motion Estimation for Video Coding." Proc. 1992 South African Symposium on Communications and Signal Processing, pp. 105–110, Sep. 11, 1992.

Primary Examiner—Jon Chang
Attorney, Agent, or Firm—Gerald E. Laws; William B. Kempler; Richard L. Donaldson

[57] ABSTRACT

Method and device for enabling high-speed write/read operation of image information in units of blocks, so as to fully meet the demand on high-speed operation of MPEG, etc. Eight memory arrays MA1–MA8 are parallelly-connected in image memory unit 10; hence, in each memory array MAi, image can be written/read individually under control of write address generating circuit 12, memory array control logic 14, and read address generating circuit 16. The input/output terminals of memory arrays MA1–MA8 are connected to half-pel operation circuit 24 through eight data registers DREG1–DREG8 of input/output buffer 18, eight row selectors YSEL1–YSEL8 and column selector XSEL of selector circuit 20, and data bus 22.

13 Claims, 19 Drawing Sheets

FIG. 17

PIPELINE IMAGE PROCESSING METHOD AND DEVICE FOR COMPUTING IMAGE BLOCK ON HALF-GRID

This application is a Continuation, of application Ser. No. 08/119,931, filed Sep. 10, 1993 now abandoned.

FIELD OF INVENTION

Our invention relates to processing of digital images, and more particularly to methods and circuits for processing a digital image in uniform smaller blocks of pixels.

PRIOR ART

In digital image processing, a memory is needed to store the image information. FIG. 26 shows the configuration of a conventional image memory used for MPEG (Moving Picture Expert Group) encoding, a standard moving picture compression technology. This image memory is made of multiple general-purpose DRAMs (Dynamic Random Access Memories) 100 and an MPEG interface circuit 102.

In MPEG, image processing is performed in units of blocks of 8 pixels×8 lines, each pixel having 8 bits. The image information is written/read into/from the image memory in units of 8×8 blocks. In a write operation, the image information for a picture is input in order as 8×8 blocks according to prescribed specifications. Consequently, the blocks may be stored in several DRAMs 100 in which memory regions correspond to block sites in the image information address space. In a read operation, one should be able to designate at any site a desired area AR with the same size as that of the input block unit regardless of the boundaries of the input block units, and one should even be able to designate the desired block's area by means of the mid-points of the pixel grid, that is on the half-grid. Corresponding to the designated area AR, 8×8 pixels (each of 8 bits) are to be output. The MPEG specifications are determined to meet these requirements. When the desired area AR is designated on the half-grid, a larger working block of 9×9 pixels (each of 8 bits) containing the desired area is read from DRAMs 100 to interface circuit 102 for MPEG processing. After half-pel processing in the interface circuit 102, an 8×8 block of averaged pixels is output. In this half-pel processing, the average value is taken of the pixels on opposite sides of the half-grid, and the obtained average values are output as the pixels read on the half-grid.

In interface circuit 102, a DRAM control circuit 104 carries out such functions as write/read control, address generation, allocation of image information, etc., with respect to each DRAM 100. In a read operation for the working block, its image information of 9 pixels×9 lines containing the desired area AR is fetched from DRAMs 100 and placed in a common data register 106 large enough (81 pixels×8 bits) to hold the working block. Adders 108, 110 and 112 are used for the half-pel processing. The image information of 8×8 pixels in the case of non-half-pel processing, or the computed image information of 8×8 pixels after the half-pel processing, are temporarily stored in a common output data register 114. In a read operation, half-pel processing control circuit 116 determines whether or not half-pel processing should be carried out based on the address signal designating the area from DRAM control circuit 104. On the basis of this determination control is performed for the operation of data registers 106, 114, and adders 108–112.

FIG. 27 shows the configuration of DRAM 100. Just as a conventional DRAM, DRAM 100 includes a memory array 120 with a matrix of memory cells, a row decoder 122 and a column decoder 124 which decode and select a memory address in memory array 120 designated by an external address signal AD, and a timing control circuit 126 which provides prescribed timing signals to its various parts in response to external memory control signals RAS-, CAS-.

However, in MPEG, since the image information for a compressed moving picture is processed, a large-volume, high-speed image memory is needed. As an example, one set of the specifications include a memory volume of 4 Mb and a write/read cycle time of 35 nsec. The aforementioned conventional image memory is made of 4-Mb memory containing 16 parallel-connected 256 Kb (×4) DRAMs for realizing high speed operation. However, for each cycle of memory access, the DRAM must be refreshed, and an 8-bit or 10-bit adder is needed to perform the half-pel processing for the image information read from DRAM. Consequently, it is impossible to make continuous output of the image information for a 9×9 pixel working block in a 35 nsec cycle.

OBJECT OF THE INVENTION

An object of the present invention is to provide a method and device for image processing wherein the write/read operations of the image information can be performed in block units at high speed to enable the image information operation to meet the specifications required for high-speed operation of MPEG encoding, etc.

SUMMARY OF THE INVENTION

The present invention provides an image information method in which one-picture image information is divided into multiple blocks in matrix form, and the multiple blocks are allocated to multiple memory arrays in such a way that any four adjacent blocks forming a square are stored in corresponding different memory arrays to enable pipeline pixel processing for MPEG and the like.

The image information device in accordance with this invention has multiple memory arrays which can perform independent memory accesses, write means by which the unit image information divided into multiple blocks in matrix form in the information address space are stored in block units in the memory arrays so that any four adjacent blocks forming a square are stored in corresponding different memory arrays, reading means which reads all of the image information contained in one desired block (or multiple blocks which at least partially overlap with a desired area AR which has the same size as a block in the image information address space and which is defined at an arbitrary position) and extracts the information corresponding to the aforementioned desired block or area AR from the read information, and a half-pel processing operation means which performs half-pel processing on the information extracted by the reading means.

The half-pel processing method of this invention comprises the steps of: from the memory means storing one-picture image information, reading out the pixels in the prescribed area designated at an arbitrary site within the picture by row or column; storing the single row or column of pixels read out, outputting the data for each pixel in a prescribed number of cycles with multiple bits in each cycle, from the lower bit; adding for each position of the output multiple bits for the adjacent pixels; and combining the sums calculated for each position to form the average value for pairs of adjacent pixels.

In the method according to the present invention, multiple blocks are allocated to multiple memory arrays so that any four adjacent blocks forming a square are stored in corresponding different memory arrays. Consequently, when the desired area AR to be read is designated as any site with the same size as that of a block, the image information in 1–4 blocks, which at least partially overlap the desired area AR can be read at the same time. From the image information read out, the necessary image information corresponding (related) to the designated read area AR is extracted for half-pel processing, so that the desired pixels can be output in block units. By using the half-pel processing method of this invention, the operation can be executed via pipelining. Consequently, the desired pixels can be output without interruption.

BRIEF DESCRIPTION OF THE DRAWINGS

FIG. 17 shows the pattern of the 9×9 pixels read from the memory arrays corresponding to the first through fourth read patterns in this embodiment.

Figure 1:
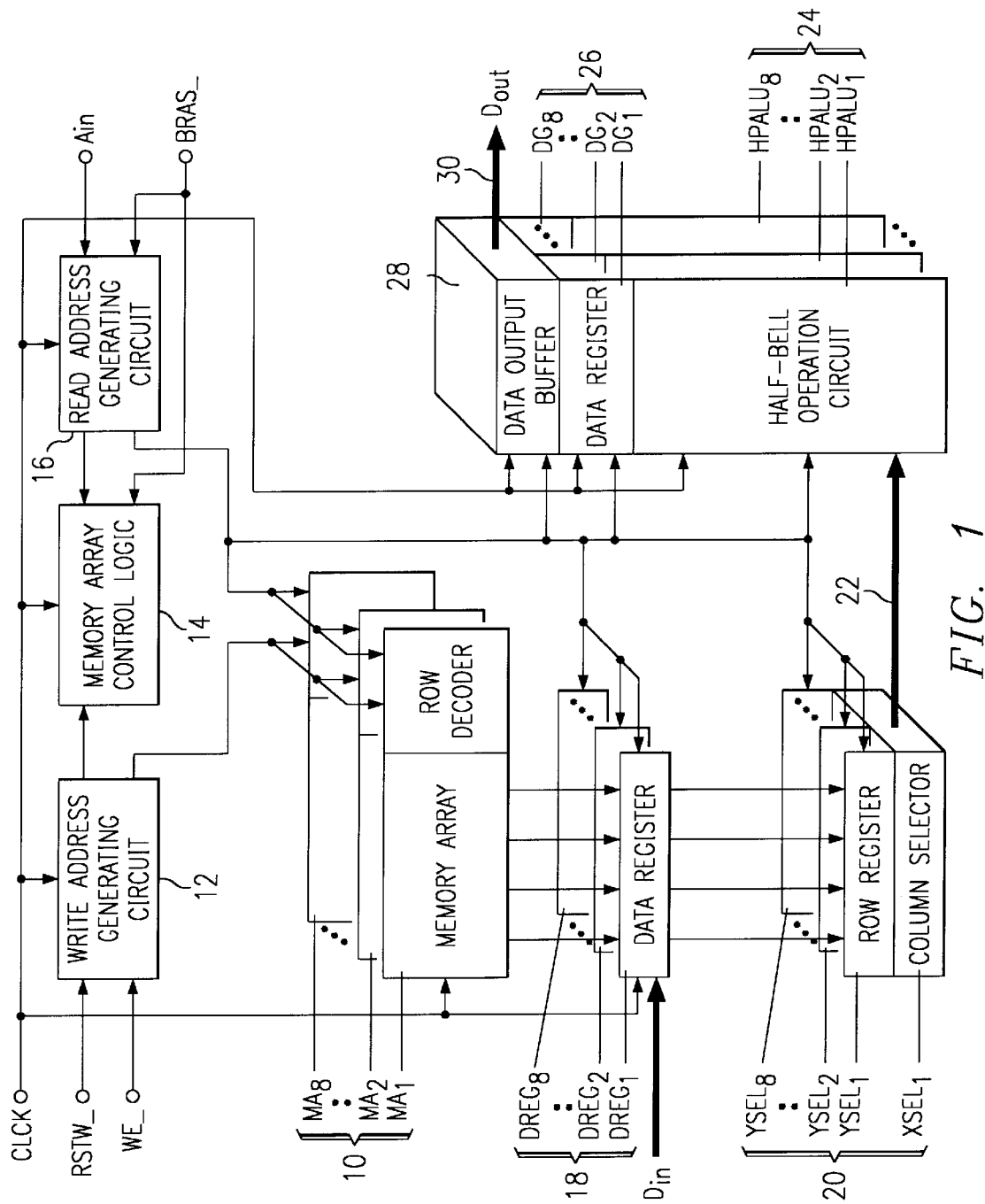
FIG. 1 is a block diagram of the overall configuration of an embodiment of an image memory for MPEG in accordance with our invention.

In the drawings, 10 is an image memory unit, MA1–MA8 memory arrays, 12 a write address generating circuit, 14 memory array control logic, 16 a read address generating circuit, 18 an input/output buffer, DREG1–YREG8 data registers, 20 a selector circuit, DSEL1–DSEL8 row selectors, XSEL a column selector, 22 a data bus, 24 a half-pel operation circuit, HPALU1–HPALU8 operation units, 26 a data register, and DG1–DG8 are output registers.

DESCRIPTION OF THE PREFERRED EMBODIMENTS

In the following, this invention will be explained in more detail with reference to embodiments illustrated in FIGS. 1–25.

FIG. 1 shows the overall configuration of the image memory for MPEG in an embodiment of this invention. This information memory is manufactured in the form of 1-chip memory with a volume of 4 Mb. In this image memory, image memory unit 10 is made of 8 conventional memory arrays MA1–MA8 connected in parallel. In this configuration, each memory array MAi can perform write/read of its individual image information under control of write address generating circuit 12, memory array control logic 14, and read address generating circuit 16.

The input/output terminals of memory arrays MA1–MA8 are respectively connected to 8 data registers DREG1–DREG8 of an input/output buffer 18. Each data register DREGi performs serial-in/parallel-out operation in write mode, and parallel-in/parallel-out operation in read mode. It has 512 bits, so it can store 8×8 pixels (of 8 bits each) of the image information (a block of information) at one time. The image information is input to/output from each respective memory array MAi in 8×8 pixel block units via its corresponding data register DREGi.

Figure 18:
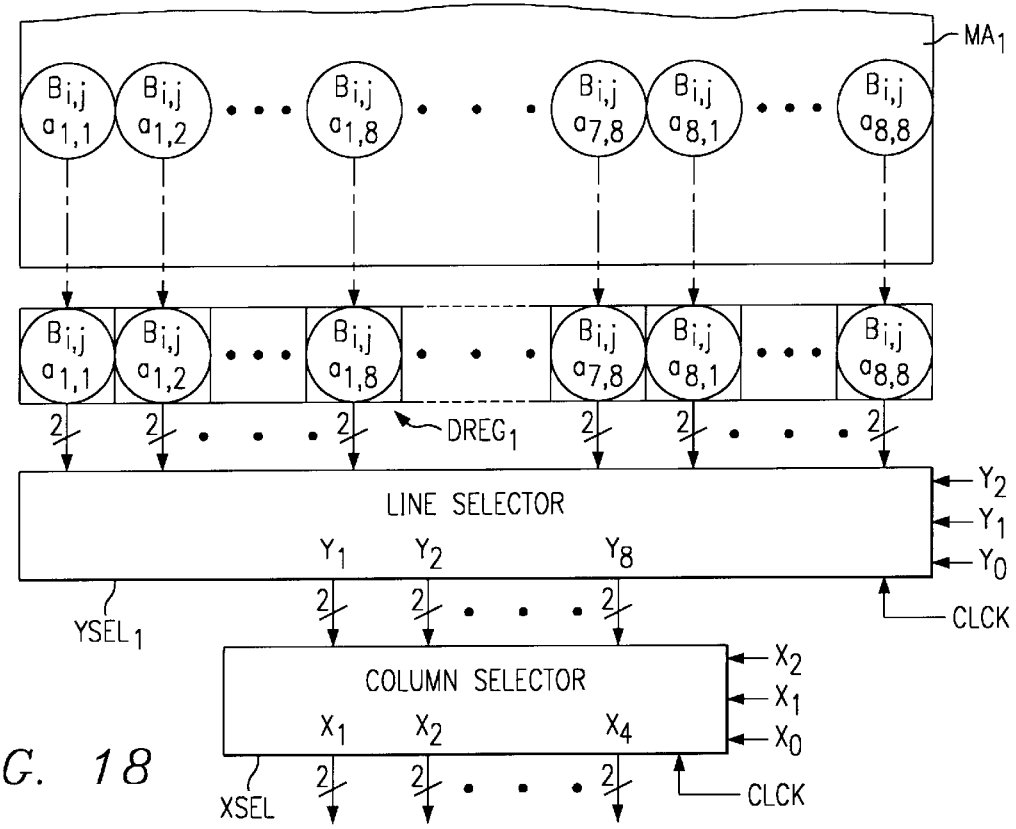
FIG. 18 shows the state of the read operation of the various pixel data of block Bi,j in row i and column j from first memory array MA1.

When data registers DREG1–DREG8 receive input, their output terminals are connected to the input terminals of the 8 row selectors YSEL1–YSEL8 of selector circuit 20, respectively. These row selectors YSEL1–YSEL8 can each select a prescribed row of 8 pixels from the 64 pixel block read from its corresponding memory array MAi. The output terminals of row selectors YSEL1–YSEL8 are connected to the input terminals of a common column selector XSEL. This column selector XSEL is used for selecting just the pixels in columns within the desired area AR from each prescribed row of 8 pixels output by one of the row selectors YSEL1–YSEL8. As shown in FIG. 18, column selector XSEL has parallel output lines for 9 pixels, at 2 bits/cycle.

The output terminals of column selector XSEL are connected to the 9 pixel (at 2 bits/cycle) inputs of a half-pel processing operation circuit 24 via a data bus 22 of 9 pixels×2 bits. The half-pel processing operation circuit 24 is made of 8 operation units HPALU1–HPALU8, each having inputs for 2 pixels (at 2 bits/cycle). These operation units HPALU1–HPALU8 perform half-pel processing in parallel to respectively produce output pixels 1–8, and they operate in parallel. In this way, half-pel processing is carried out one row at a time. The output terminals of operation units HPALU1-HPALU8 are respectively connected to the input terminals of eight (8-bit) pixel output registers DG1–DG8 forming a data output register 26. These registers DG1–DG8 have their output terminals connected in common to a common data output buffer 28. The output terminals of data output buffer 28 are connected to an 8-bit data output bus 30.

In our image memory, a write operation to image memory unit 10 is carried out under control of write address generating circuit 12 and memory array control logic 14. In the following, the write operation will be explained with reference to FIGS. 2–10.

Figure 2:
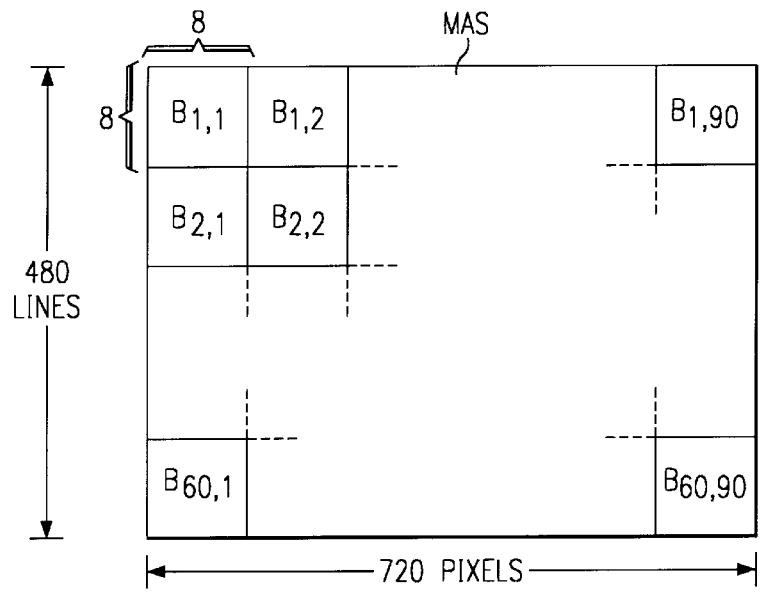
FIG. 2 illustrates an example of the address space MAS of the image of one picture stored in the image memory in the embodiment of FIG. 1.
Figure 3:
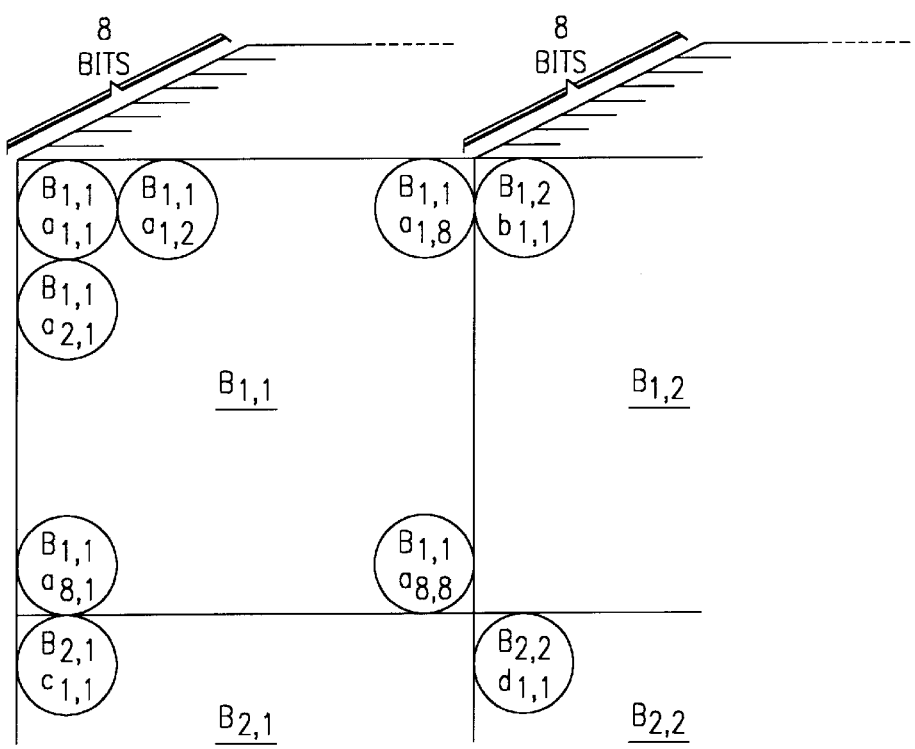
FIG. 3 illustrates the allocation (distribution) of the pixels in the blocks of image information address space MAS.

FIG. 2 shows an example of address space MAS of the image information of one picture stored in the image memory. FIG. 3 shows the allocation (distribution) of the pixels in the blocks of image information address space MAS. As can be seen from FIG. 2, one picture of 720 pixels×480 lines are divided in matrix form into 90×60 (5400) blocks B1,1, B1,2, . . . B60,90 according to image processing format. As shown in FIG. 3, each block Bi,j contains 8 pixels×8 lines of pixels (of 8 bits each). For example, the one-picture image information having the aforementioned image information address space can be obtained from the receiving/demodulation unit of a TV receiver.

Figure 4:
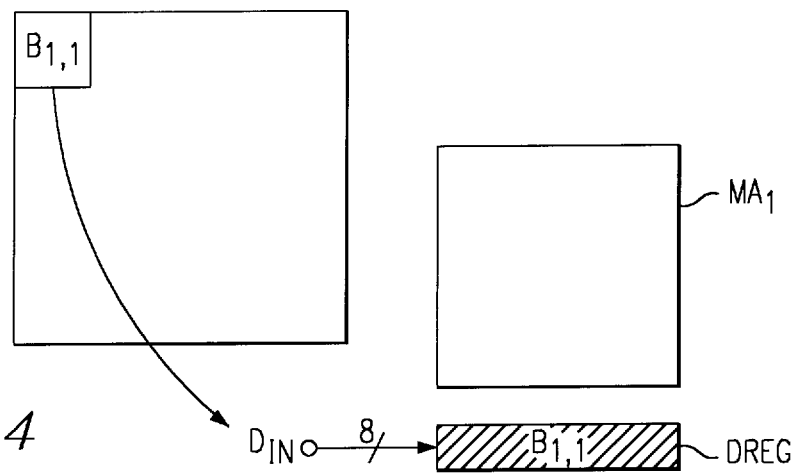
FIG. 4 illustrates the state when input block B1,1 of row 1 and column 1 is loaded in first data register DREG1 corresponding to first memory array MA1.
Figure 5:
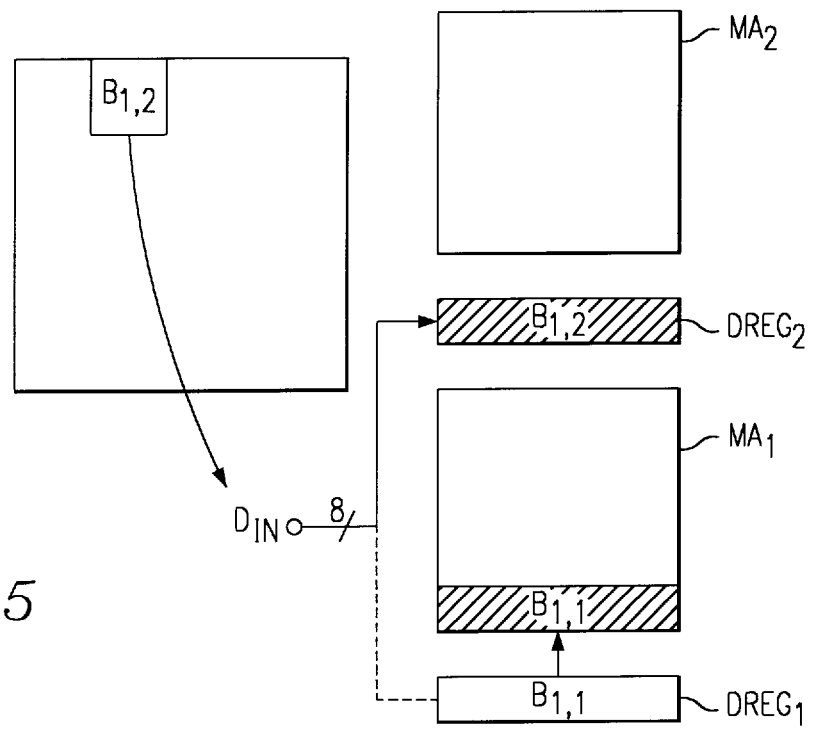
FIG. 5 illustrates the state when input block Bl.2 of row 1 and column 2 is loaded in second data register DREG2 corresponding to second memory array MA2, while block B1.1 of row 1 and column 1 is transferred from first data register DREG1 to first memory array MA1.
Figure 6:
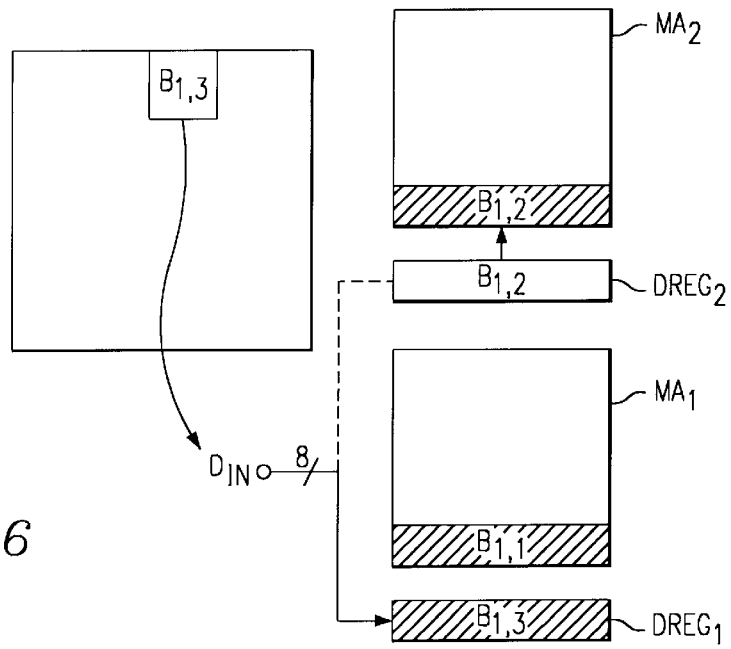
FIG. 6 illustrates the state when input block B1,3 of row 1 and column 3 is loaded in first data register DREG1, while block B1 1 2 of row 1 and column 2 is transferred from second data register DREG2 to second memory array MA2.

First, as shown in FIG. 4, block B1,1 of the first block row and first block column is loaded as input data $D_{in}$ into first data register DREG1. Then, as shown in FIG. 5, block B1,2 of the first row and second column is loaded as input data $D_{in}$ into second data register DREG2. While block B1,2 is loaded into second data register DREG2, block B1,1, which has been loaded into first data register DREG1, is transferred to the first row of first memory array MA1. This transfer command is generated by memory array control logic 14. Then, as shown in FIG. 6, while block B1,3 in first row and third column is loaded as input data Din into first data register DREG1, block B1,2, which has been loaded into second data register DREG2, is transferred to the first row of second memory array MA2.

In this way, from blocks B1,1–B1,90 of the first row, blocks B1,1, B1,3 . . . B1,89 of the odd columns are written in order into first memory array MA1 through first data register DREG1, and blocks B1,2, B1,4 . . . B1,90 of the even columns are written in order into second memory array MA2 through second data register DREG2.

Figure 7:
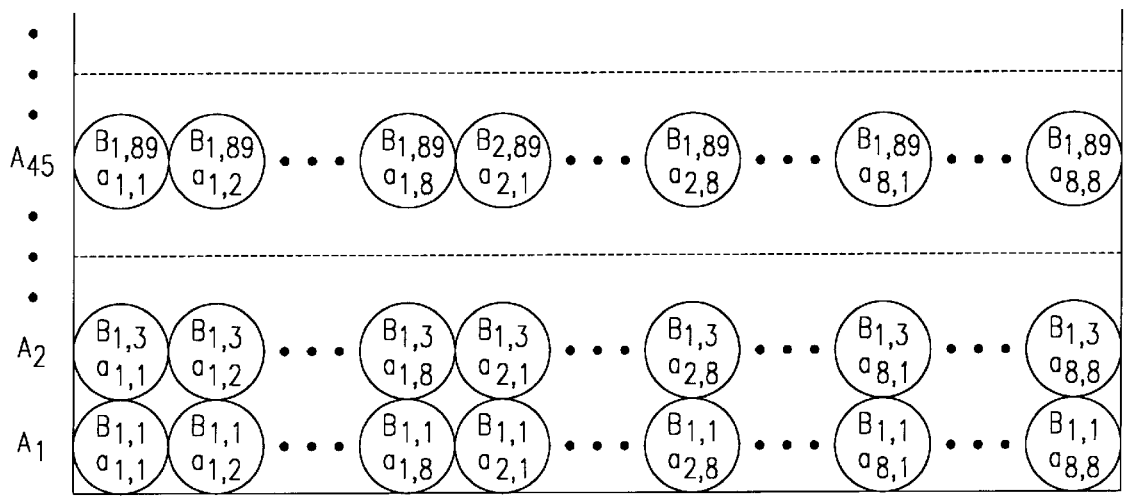
FIG. 7 shows the configuration of the allocation of the image information in first memory array MA1.

FIG. 7 shows the memory map illustrating the configuration of the image in first information array MA1. Stored in the first row (row A1) of first memory array MA1 are the 64 pixel data (8 bits each) B1,1, a1,1; B1,1, a1,2; . . . B1,1, a1,8; . . . B1,1, a8,8 contained in block B1,1 of the first row and first column in image information address space MAS. Stored in the second row (row A2) of first memory array MA1 is the 64 pixel data B1,3, a1,1; B1,3, a1,2; . . . B1,3, a1,8; . . . B1,3, a8,8 contained in block B1,3 of the first row and third column in image information address space MAS. In this way, rows 1–45 of first memory array MA1 store the 64 pixel data contained in the 45 blocks B1,1, B1,3 . . . B1,89 of the odd-numbered columns in the first row. Similarly, rows 1–45 of second memory array MA2 store the 64 pixel data contained in the 45 blocks B1,2, B1,4, . . . B1,90 of the even-numbered columns in the first row, respectively.

Figure 8:
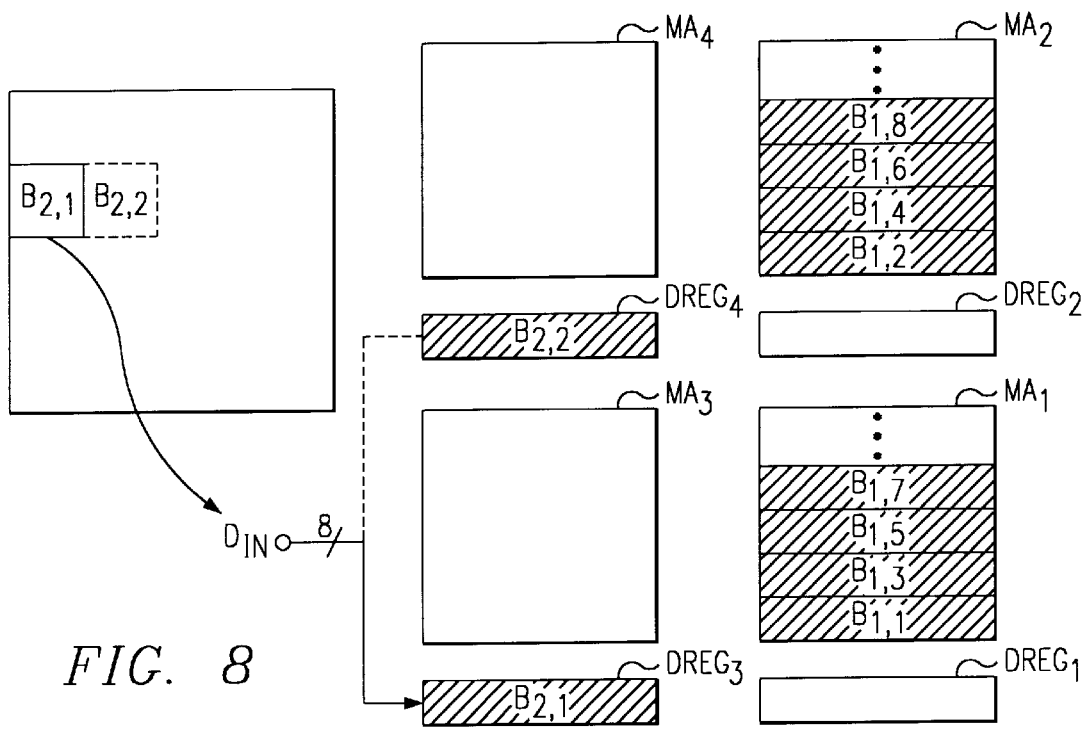
FIG. 8 illustrates the state in which the input row-2 blocks B2,1, B2,2, . . . are written with a prescribed allocation into third and fourth memory arrays MA3, MA4.
Figure 9:
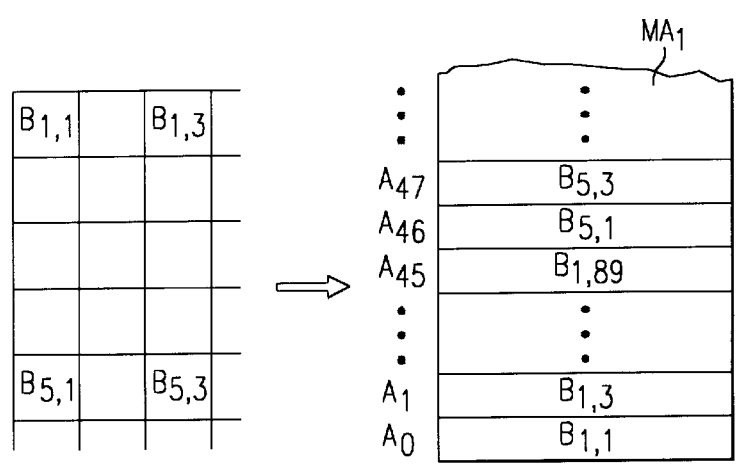
FIG. 9 illustrates the state in which the blocks in the odd-numbered row U+1 in the image information address space are allocated and written in first memory array MA1.

As pointed out in the above, first-row blocks B1,1, B1,2, . . . B1,90 are written into first and second memory arrays MA1, MA2, respectively. Then, as shown in FIG. 8, with the same method of allocation as above, second-row blocks B2,1, B2,2, . . . B2,90 are written into third and fourth memory arrays MA3, MA4, respectively. That is, among blocks B2,1–B2,90 of the second row, blocks B2,1, B2,3, . . . B2,89 of the odd columns are written in order into third memory array MA3 through third data register DREG3, and blocks B2,2, B2,4, . . . B2,90 of the even columns are written in order into fourth memory array MA4 through fourth data register DREG4.

After the end of the write operation of the second-row blocks, with the same allocation method above, third-row blocks B3,1, B3,2, . . . B3,90 are written into fifth and sixth memory arrays MA5, MA6 through fifth and sixth data registers DREG5 and DREG6, respectively. Then, with the same allocation method above, fourth row blocks B4,1, B4,2, . . . B4,90 are written into seventh and eighth memory arrays MA7, MA8 through seventh and eight data registers DREG7 and DREG8, respectively.

Figure 10:
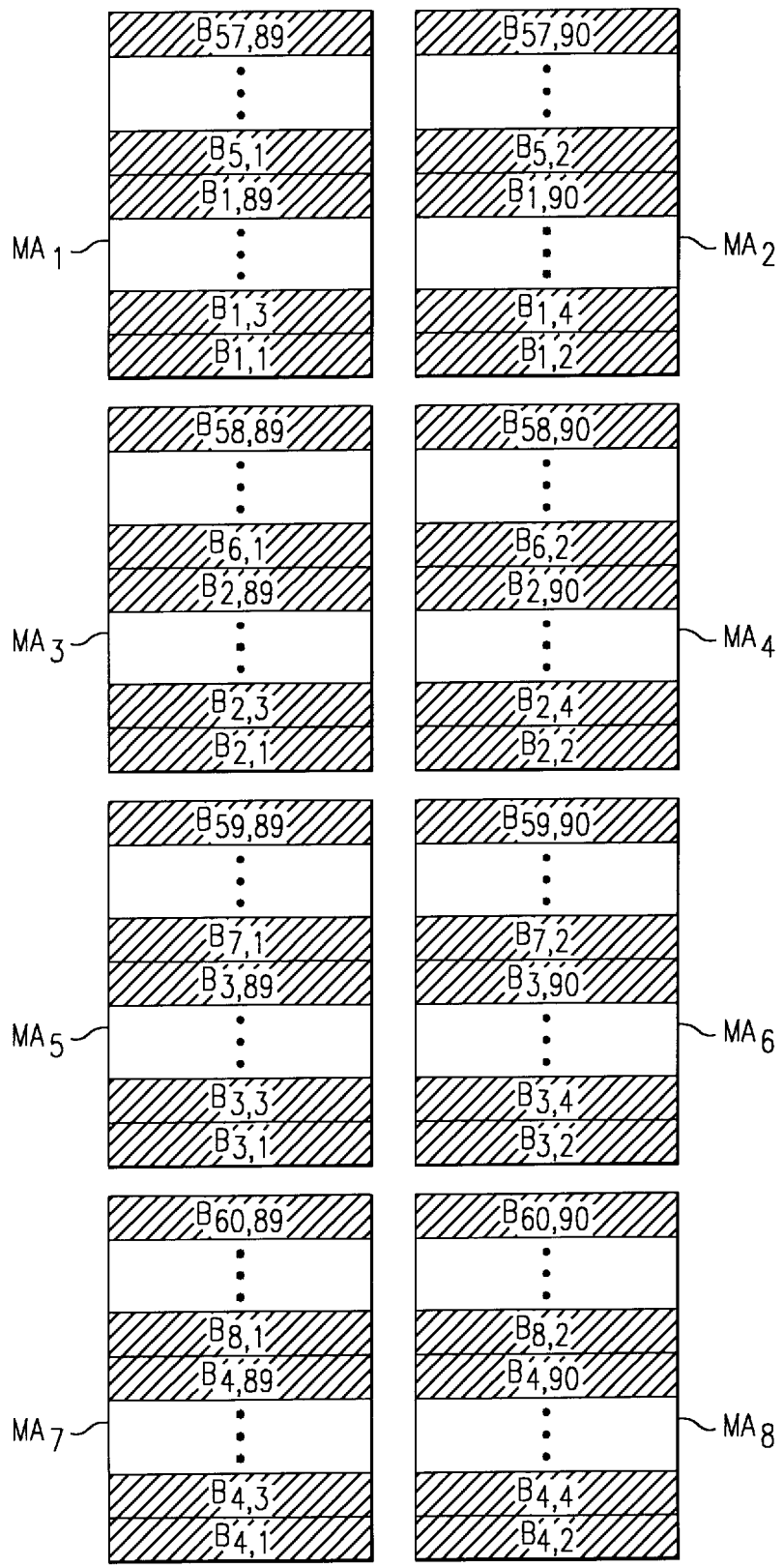
FIG. 10 illustrates the state in which all of the blocks in the image information address space are allocated and written in the first through eighth memory arrays MA1–MA8.

In this way, blocks in rows 1–4 B1,i, . . . B4,90 are written into first—eighth memory arrays MA1–MA8,respectively. Then, fifth-row blocks B5,1, B5,2, . . . B5,90 are written into first and second memory registers MA1 and MA2, respectively. As shown in FIG. 10, in first memory array MA1 after first-row odd-numbered-column blocks B1,1, . . . B1,89, fifth-row odd-numbered-column blocks B5,1, B5,3, . . . B5,89 are stored in order into memory addresses A45, A46, . . . , respectively. In second memory array MA2, after first-row even-numbered-column blocks B1,2, . . . B1,90, fifth-row even-numbered column blocks B5,2, B5,4 . . . B5,90 are stored in order.

In the aforementioned allocation method, the image information of one picture is written in 8×8 block units into 8 memory arrays MA1–MA8. As a result, as can be seen from FIG. 10, the blocks in the odd-numbered columns and even-numbered columns in row (4N+1) (N=0, 1, . . . 14) are stored in first and second memory arrays MA1 and MA2, 1 block/1 row at a time; the blocks in the odd-numbered columns and even-numbered columns in row (4N+2) are stored in third and fourth memory arrays MA3 and MA4, 1 block/1 row at a time; the blocks in the odd-numbered columns and even-numbered columns in row (4N+3) are stored in fifth and sixth memory arrays MA5 and MA6, 1 block/1 row at a time; and the blocks in the odd-numbered columns and even-numbered columns in row (4N+4) are stored in seventh and eighth memory arrays MA7 and MA8, 1 block/1 row at a time.

Figure 11:
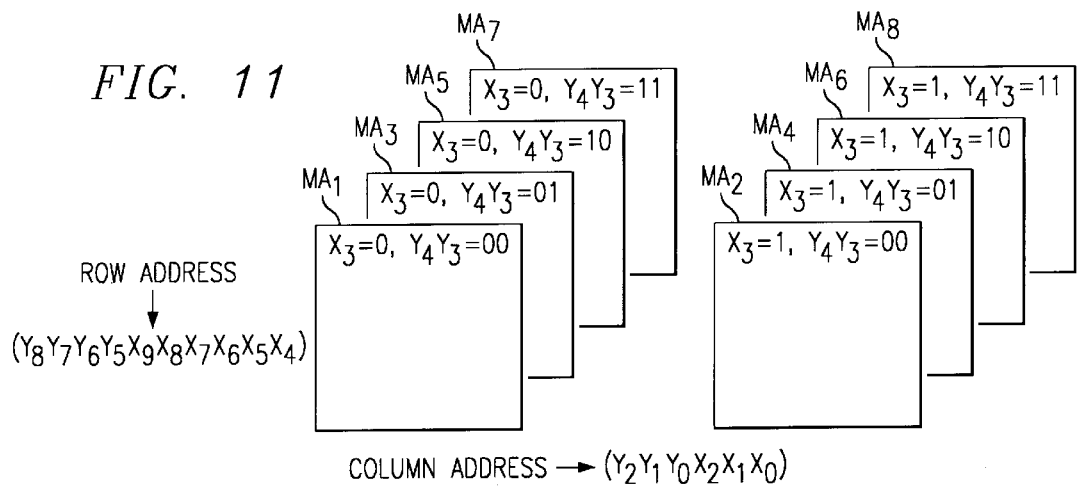
FIG. 11 shows the method of allocation of addresses in this embodiment.

FIG. 11 shows the allocation method of the addresses in this embodiment. In write mode, the memory address is generated as a 19-bit address signal, which is a special combination to be explained later, of 10 bits of X-address (X9, X8, . . . X0) and 9 bits of Y-address (Y8, Y7, . . . Y0), by a write generating circuit 12. Each address value corresponds to a pixel datum (8 bits). Write generating circuit 12 has an address counter; it starts the operation corresponding to write reset signal RSTW-, and it generates the write address signal with an increment of unity for each period of clock signal CLCK. Corresponding to the write signal from write address generating circuit 12, memory address control logic 14 provides the desired command signals to the various memory arrays MAi and various data registers DREGi.

Of these memory addresses, X-address (X9, X8, ... X0) and Y-address (Y8, Y7, ... Y0) respectively correspond to the binary addresses (coordinates) of the image address space MAS in the X direction and Y direction.

In the image information address space MAS, the lower 3 bits (X2, X1, X0) of the X-address represent the positions of the 8 columns within each block Bi,j, and the lower 3 bits (Y2, Y1, Y0) of the Y-address represent the positions of the 8 rows in each block Bi,j. Consequently, the range of the 6-bit address comprised of these lower 3 bits (Y2, Y1, Y0, X2, X1, X0) represents the allocation positions of the 64 pixels in each block Bi,j. In the image memory arrays, the 6-bit address (Y2, Y1, Y0, X2, X1, X0) is the column address representing the positions of the 64 pixels in a block, that is, the column positions of the pixels of each block as stored (one row per block) in each memory array MAi.

The fourth bit (X3) in the X-address, counting from the lower bit, takes on value "0" for even-numbered block columns and value "1" for odd-numbered block columns in image address space MAS. In the image memory, this bit (X3) takes on value "0" for the odd-numbered memory arrays MA1, MA3, MA5 and MA7, and value "1" for the even-numbered memory arrays MA2, MA4, MA, and MA8.

In the image information address space MAS, the two bits, that is, the fourth and fifth bits, (Y4, Y3) of the Y-address, counting from the lower bit, represent where the block is located among the four row groups of rows 4N+1, rows 4N+2, rows 4N+3, and rows 4N+4 (N=0, 1, . . . 14). These two bits take on the values of "0," "0" for rows 4N+1, the values "0," "1" for rows 4N+2, the values "1," "0" for rows 4N+3, and the values "1," "1" for rows 4N+4. In the image memory, these two bits (Y4, Y3) take on the values "0," "0" for the first and second memory arrays MA1, MA2, the values "0," "1" for third and fourth memory arrays MA3, MA4, the values "1," "0" for fifth and sixth memory arrays MA5, MA6, and the values "1," "1" for seventh and eighth memory arrays MA7, MA8.

In the image information address space MAS, the upper 6 bits (X9, X8, X7, X6, X5, X4) of the X-address represent the relative positions among the odd-numbered block columns or among the even-numbered block columns. Namely, each row of blocks in the image has 45 odd-numbered block columns and 45 even-numbered block columns. These 45 odd-numbered block columns or 45 even-numbered block columns in each row are continuously written into a corresponding memory array MAi, one block/one line at a time. The upper 4 bits of the Y-address (Y8, Y7, Y6, X5 [sic; Y5]) represent the positions of the 15 rows in the four groups of rows 4N+1, rows 4N+2, rows 4N+3, and rows 4N+4 (N=0, 1, . . . 14) in image information address space MAS. These blocks belonging to the 15 rows in each of the groups are continuously written into a corresponding memory array MAi, one block/one line at a time. In the image memory, the 10-bit address (Y8, Y7, Y6, Y5, X9, X8, X7, X6, X5, X4) made up of a sum of the upper 6 bits of the X-address (X9, X8, X7, X6, X5, X4) and the upper 4 bits of the Y-address (Y8, Y7, Y6, Y5) is the row address of a particular block within each memory array MAi.

The read operation in the image memory in this embodiment with reference to FIGS. 12–25 is performed in units of blocks. On the other hand, in the write operation, agreement with block Bi,j divided into matrix form may be present or absent, and an area with the same size 8×8 as that of block Bi,j designated at any site in image information address space MAS can be externally designated. In order to designate the area to be read, the address which represents the upper-left end position of the desired area in image information address space MAS is input as external address $A_{in}$ to read address generating circuit 16. On the other hand, read start signal BRAS- is input into read address generating circuit 16 and memory address control logic 14. When read start signal BRAS- and external address $A_{in}$ are input to read address generating circuit 16, the read address signal needed for reading the image information in the corresponding area with reference to said external address $A_{in}$ is generated in the period of clock CLCK. Corresponding to the read address signal from read address generating circuit 16, memory address control logic 14 sends the necessary command signals to the various memory arrays MAi and various data registers DREGi.

Figure 12:
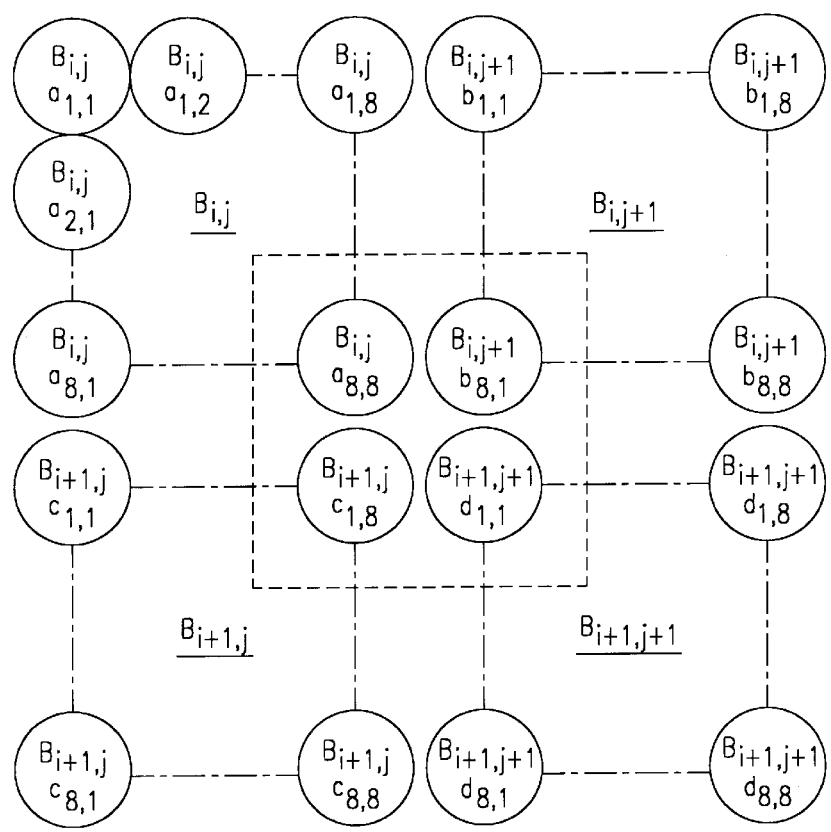
FIG. 12 illustrates the case in which area AR striding over four blocks Bi,j, Bi,j+1, Bi+1,j, Bi+1,j+1 is assigned.
Figure 13:
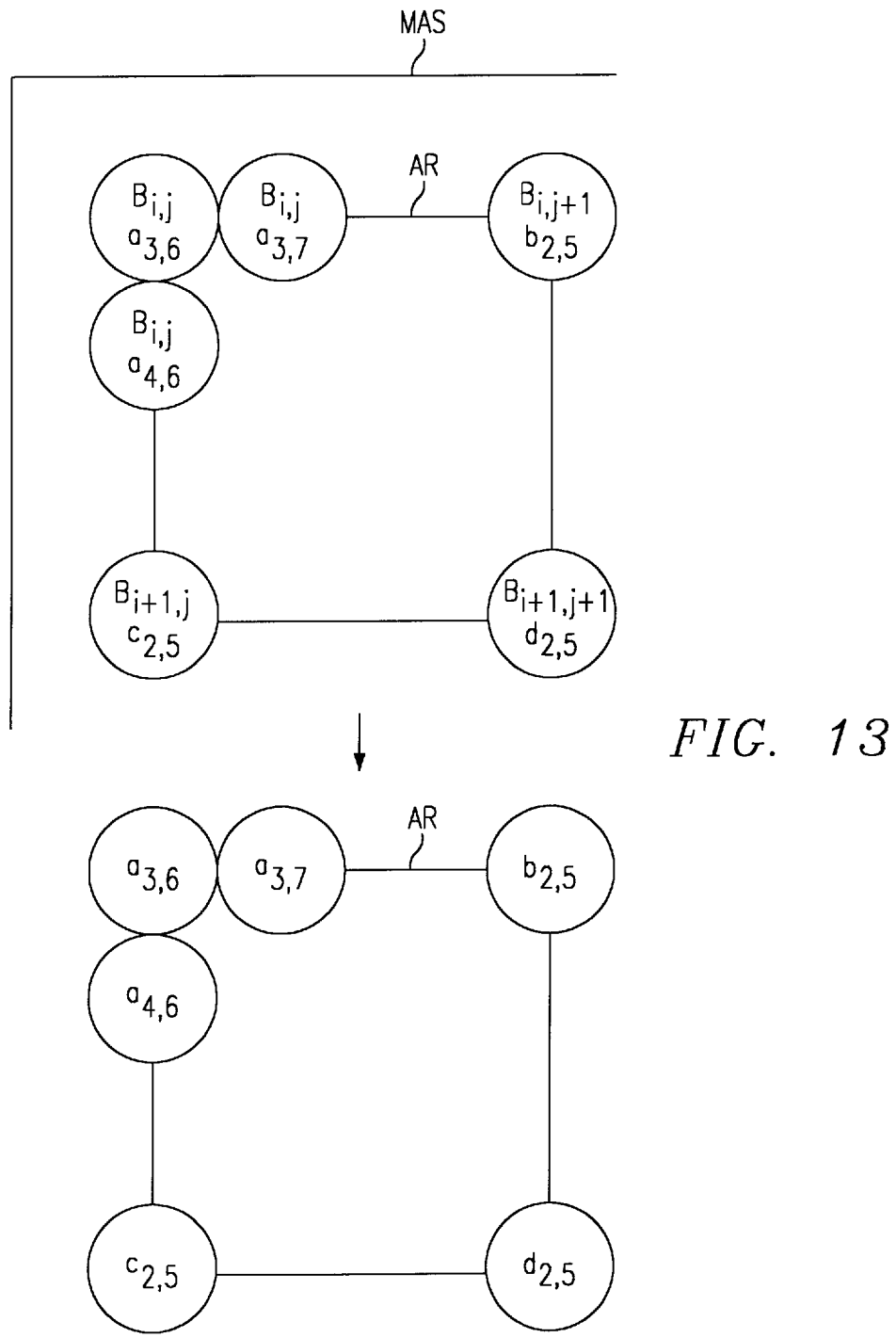
FIG. 13 shows the first pattern of the assigned read area.

FIG. 12 shows the case when area AR extends to the four blocks Bi,j, Bi,j+1 Bi+1,j, Bi+1,j+1. Although the size of the assigned read area AR is constant at 8×8, there are 4 types of patterns in consideration of the relation with the grids of the blocks. As shown in FIG. 13, the first pattern has the pixels of area AR in agreement with the grids of the various blocks. In the example shown in the figure, the pixels Bi,j, a3,6 in block Bi,j of row i and column j are assigned the upper-left position of area AR by external address signal $A_{in}$. In this case, from the four blocks Bi,j, Bi,j+1, Bi+1,j, Bi+1,j+1 the 8×8 pixel information in area AR, Bi,j, a3,6; Bi,j, a3,7; . . . Bi+1,j+1, d2,5 are read and directly output.

Figure 14:
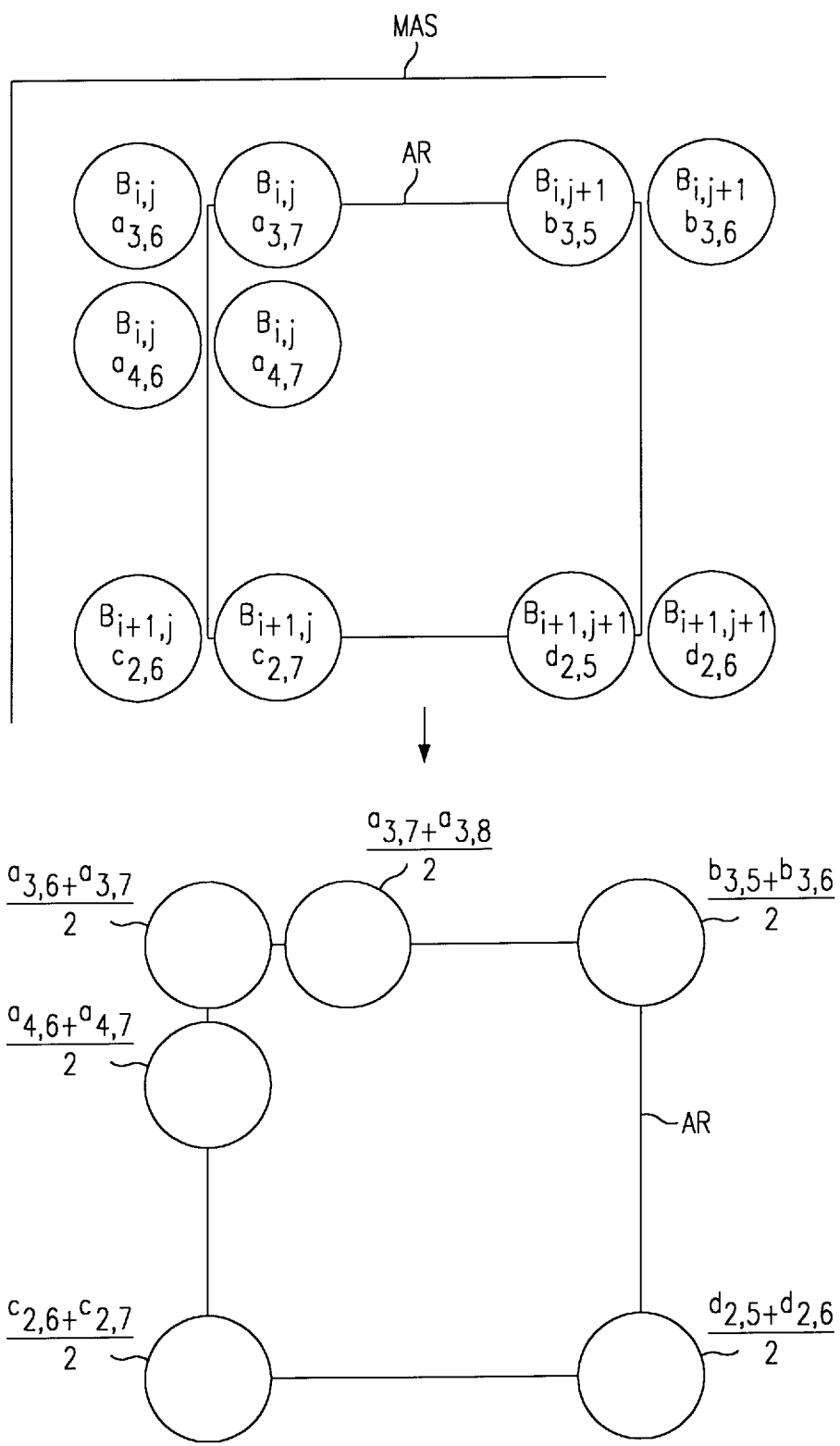
FIG. 14 shows the second pattern of the assigned read area.

As shown in FIG. 14, in the second pattern, the pixels of the assigned read area AR are located on the midpoints of the X grid points, that is, at mid-points between existing X axis grid points, the X half-grids of the various blocks. In the example shown in the figure, the midpoint between pixels Bi,j, a3,6 and Bi,j, a3,7 in block Bi,j of row i and column j is assigned as the upper-left position of area AR by means of external address signal $A_{in}$. In this case, external address signal $A_{in}$ has a Y address with an integer value and an X address to one decimal place (0.5). For the pattern of this type, not only the pixels in area AR, but also the adjacent pixels can be read from blocks Bi,j, Bi,j+1, Bi,j, Bi+1,j+1. For every two pixels in the X-direction, the average value is derived, and this average value is output as the 8×8 pixel information in area AR. This processing for deriving the average value is known as half-pel processing in the x (horizontal) direction.

Figure 15:
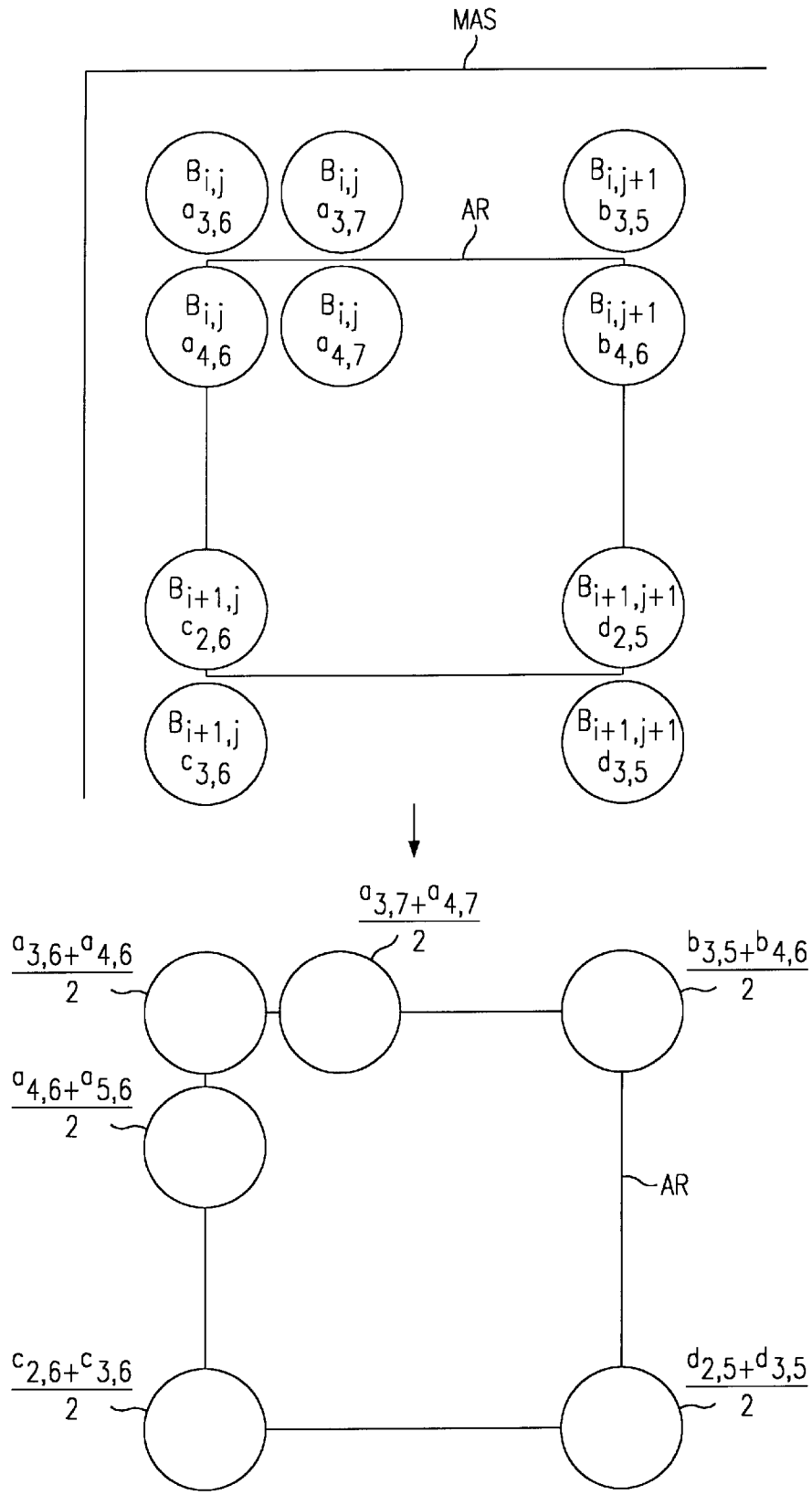
FIG. 15 shows the third pattern of the assigned read area.
Figure 16:
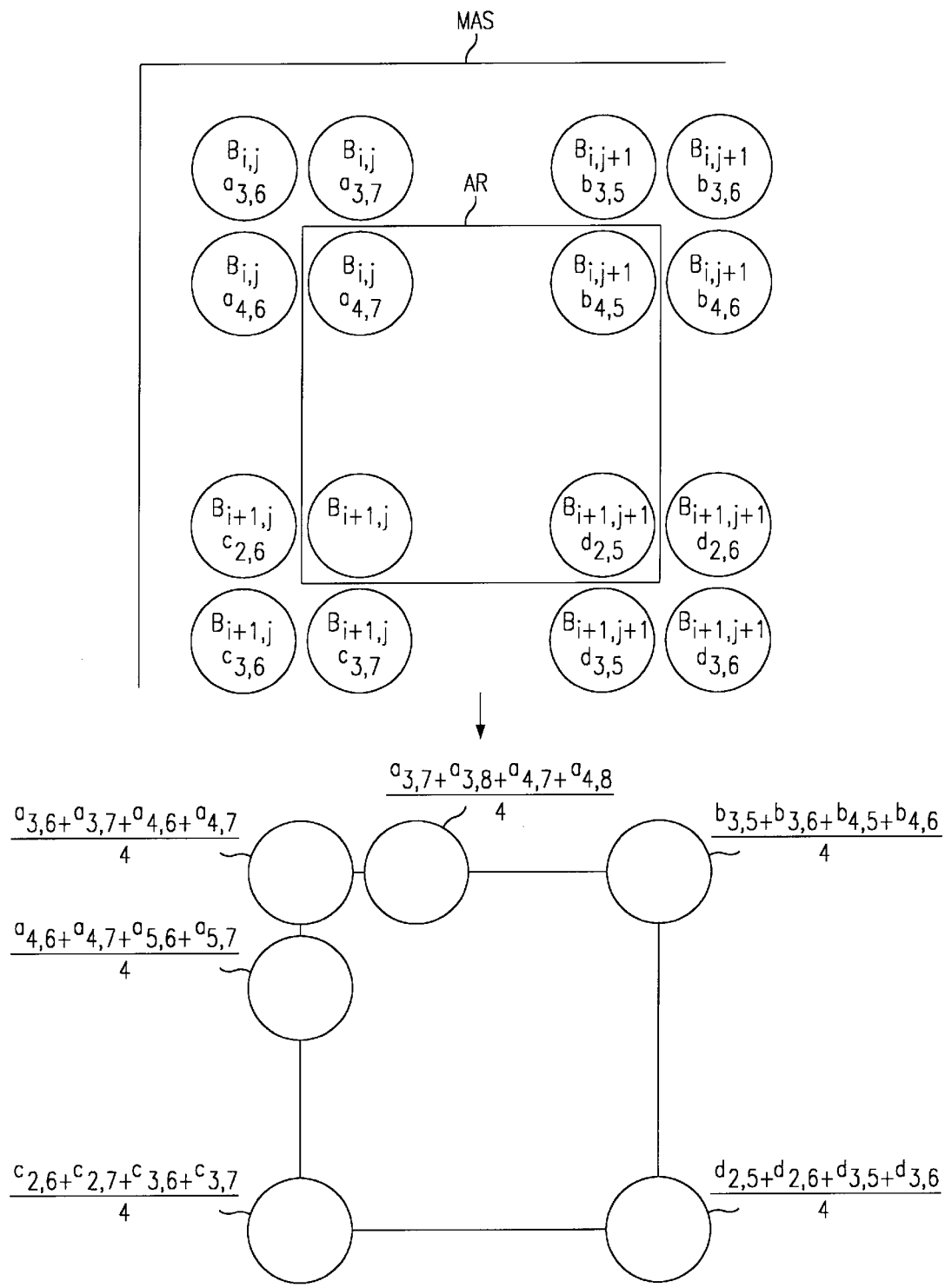
FIG. 16 shows the fourth pattern of the assigned read area.

As shown in FIG. 15, in the third read pattern, the pixels of the assigned read area AR are located at the midpoints of the Y grid points, that is, the Y half-grids, of the various blocks. In the example shown in the figure, the midpoint between pixels Bi,j, a3,6 and Bi,j, a4,6 in block Bi,j of row i and column j is assigned the upper-left position of area AR by means of external address signal $A_{in}$. In this case, external address signal $A_{in}$ has an X address with an integer value and a Y address to one decimal place (0.5). For patterns of this type, not only the pixels in area AR, but also the adjacent pixels can be read from blocks Bi,j, Bi,j+1, Bi+1,j, Bi+1,j+1. For every two pixels in the Y-direction, the average value is derived in half-pel processing, and this average value is output as the 8×8 pixel information in area AR. This is half-pel processing in the Y (vertical) direction As shown in FIG. 16, in the fourth read pattern, the pixels of the assigned read area AR are located at the midpoints of the X and Y grid points, that is, the XY half-grids, of the various blocks. In the example shown in the figure, the half-grid of four pixels Bi,j, a3,6; Bi,j, a3,7; Bi,j, a4,6 and Bi,j, a4,7 in block Bi,j of row i and column j is assigned the upper-left position of area AR by means of external address signal $A_{in}$. In this case, external address signal $A_{in}$ has both an X address and a Y address to one decimal place (0.5). For the pattern of this type, not only the pixels in area AR, but also the adjacent pixels can be read from blocks Bi,j, Bi,j+1, Bi+1,j, Bi+1,j+1. For every four pixels in the Y- and X-direction, the average value is derived with the half-pel processing, and this average value is output as the 8×8 pixel information in area AR. This is half-pel processing in both X and Y (horizontal and vertical) directions.

Figure 17:
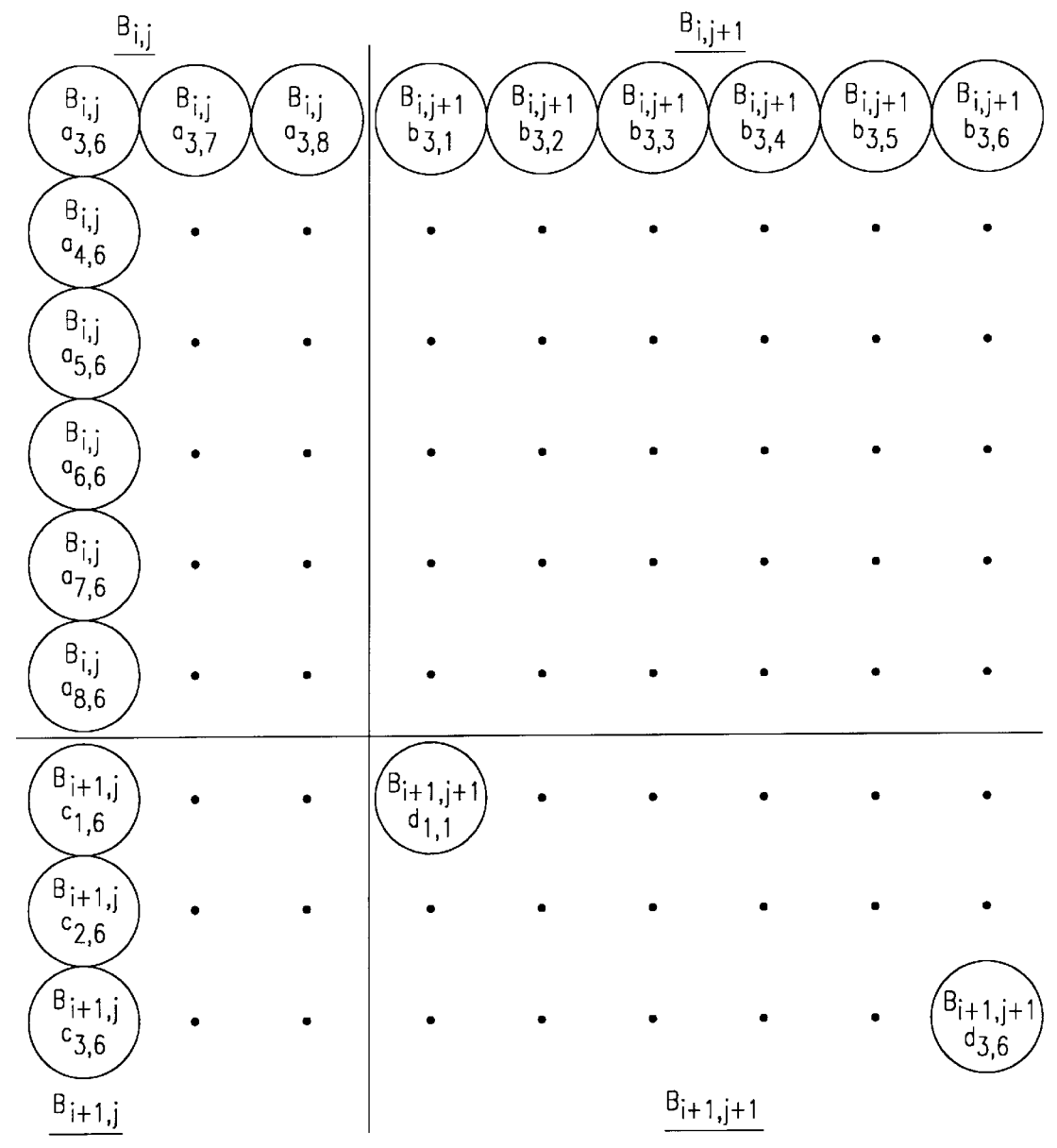

In the image memory in this embodiment, with respect to any of said first-fourth read patterns, as shown in FIG. 17, 9×9 pixels can be read from the adjacent four blocks Bi,j, Bi,j+1, Bi+1, Bi+1,j+1. The read image information is then sent to the 9 pixel inputs of half-pel processing circuit 24. These adjacent four blocks Bi,j, Bi,j+1, Bi+1, Bi+1,j+1 are stored in different memory arrays. For example, they may be stored in the first, second, third, and fourth memory arrays MA1, MA2, MA3 and MA4, respectively. In this case, reading of the 9×9 pixel information shown in FIG. 17 is carried out under control of read address generating circuit 16 and memory array control logic 14 by means of the aforementioned four memory arrays MA1–MA4, the four data registers DREG1–DREG4 related to them, four row selectors YSEL1–YSEL4, and common column selector XSEL.

First of all, these blocks Bi,j, Bi,j+1, Bi+1,j, Bi+1,j+1 are simultaneously read from the corresponding memory arrays MA1–MA4 into corresponding data registers DREG1–DREG4.

FIG. 18 illustrates the state of transfer of 64 pixel information a1,1, a1,2, . . . a1,8, a2,1, . . . a8,8 in block Bi,j from first memory array MA1 to first data register DREG1 in a parallel format. The 64 pixels of information a1,1, a1,2, . . . a1,8, a2,1, . . . a8,8 in block Bi,j transferred to first data register DREG1 are 8-bit data. Each piece of pixel information is transferred in 4 cycles, with 2 bits per cycle, from the lower bit, from first data register DREG1 to first row-selector YSEL1.

First row-selector YSEL1 receives the lower 3 bits of the Y-address (Y2, Y1, Y0) from read address generating circuit 16, and from within the block in DREG1 it selects the pixels located on the row designated by these three bits. In the example shown in FIG. 17, row-3 pixels a3,1, a3,2, . . . a3,8 initially designated by these three bits of address are pixels in the third row a3,1, a3,2, . . . a3,8. Consequently, from the eight output terminals y1, y2, . . . y8 of first row-selector YSEL1, various 8-bit data of the 8 pixels in row-3 in block Bi,j are transferred to column selector XSEL in 4 cycles, two bits per cycle. While data transfer is made from first row-selector YSEL1 to column selector XSEL, various 8-bit data b3,1, b3,2, . . . b3,8 of the 8 pixels in row-3 in block Bi,j+1 are also transferred to column selector XSEL in 4 cycles, two bits per cycle, by means of row-2 selector YSEL2 corresponding to second memory array MA2.

Column selector XSEL receives the lower 3 bits (X2, X1, X0) of the X-address from read address generating circuit 16, and selects the columns in the particular range designated by these 3 bits of address. In the case shown in FIG. 17, the 3 bits of X-address (X2, X1, X0) designate the column of the pixel in the upper-left corner Bi,j, a3,6, that is, column 6. In this case, column selector XSEL selects the pixels of the sixth and higher columns a3,6, a3,7, a3,8 for block Bi,j, and the pixels of the sixth and lower columns b3,1, b3,2, b3,3, b3,4, b3,5, b3,6 for block Bi,j+1. Then, these selected 9 pixels a3,6, a3,7, a3,8, b3,1, b3,2, b3,3, b3,4, b3,5, b3,6 are input to half-pel processing circuit 24 through data bus 22 from the 9 output terminals x1, x2, . . . x9, in four cycles, with two bits per cycle, from the lowest bit.

As pointed out in the above, among the 9×9 pixels corresponding to the assigned read area AR (FIG. 17), first of all, the various pixels in the first line a3,6, a3,7, a3,8, b3,1, b3,2, b3,3, b3,4, b3,5, b3,6 are read in four cycles, with two bits per cycle. In the following, in the same way as above, the various pixels in the second line a4,6, a4,7, a4,8, b4,1, b4,2, b4,3, b4,4, b4,5, b4,6 are read in four cycles, with two bits per cycle; the various pixels in the third line a5,6, a5,7, a5,8, b5,1, b5,2, b5,3, b5,4, b5,5, b5,6 are read in four cycles, with two bits per cycle; and finally, the various pixels in the last line, the ninth line c3,6, c3,7, c3,8, d3,1, d3,2, d3,3, d3,4, d3,5, d3,6 are read in four cycle, with two bits per cycle.

Figure 19:
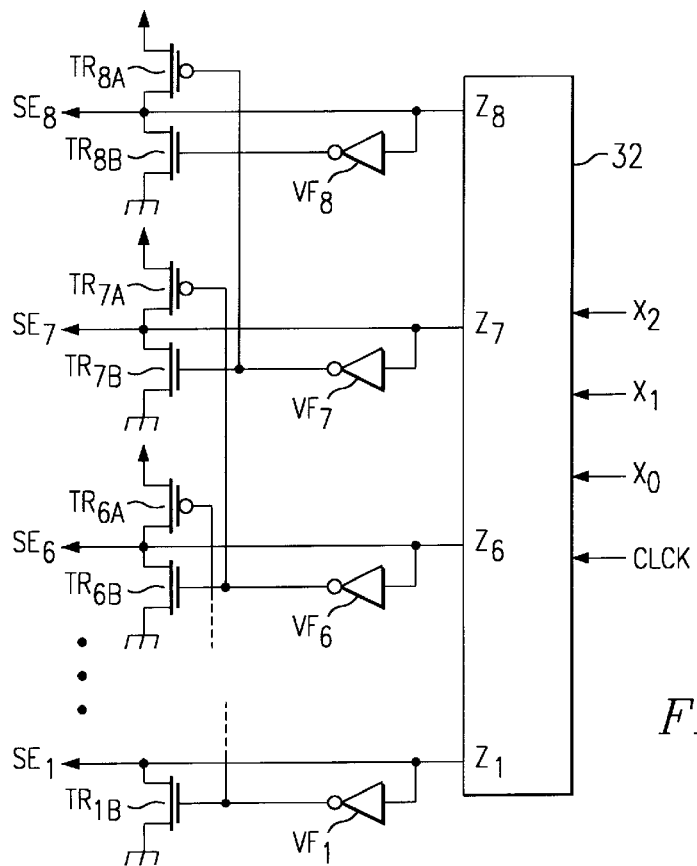
FIG. 19 is a circuit diagram illustrating a configuration example of the selector circuit that may be used in column selector XSEL in the embodiment.

FIG. 19 shows an example of a selector circuit used as column selector XSEL. In this selector circuit, 3 bits of X-address (X2, X1, X0) are input, and all of the output signals SEi, SEi+1, . . . higher than the value Pi of address (X2, X1, X0) are set on "H" level. We will not go into detail for it. It is a dynamic type decoder. SE1–SE8 are maintained at a "L" (low) signal level in the case of standby. In the active state, the selected output (one out of Z1–Z8) becomes "H," and the remaining nonselected outputs become floating "L." For example, when (X2, X1, X0) is 110, output terminal z6 of decoder 32 becomes "H," while the output terminals become the floating state "L." As "L" output signal is obtained from inverter circuit VF6 connected to this decoder output terminal z6, MOS transistor TR7A connected to output terminal z7 of the adjacent upper decoder is turned on, and decoder output terminal z7 also becomes "H." Similarly, decoder output terminal z8 also becomes "H." All of lower decoder output terminals z1–z5 remain as "L". As a result, the upper 3 output signals SE6–SE8 become "H," and the 6 lower output signals SE1–SE5 become "L." By means of a register circuit of this type, it is possible to select the pixels of column 6 and higher columns a3,6, a3,7, a3,8, as pointed out in the above.

Figure 20:
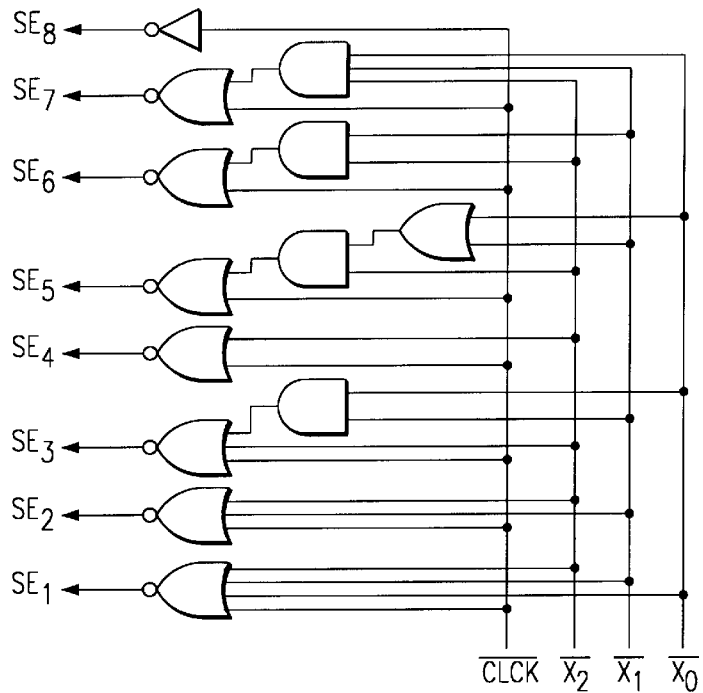
FIG. 20 is a circuit diagram illustrating another configuration example of the selector circuit that may be used in column selector XSEL in the embodiment.

In addition, the complement of X-address (X2, X1, X0) is input to decoder 32, and the more significant bits and the less significant bits of output signals SE1–SE8 are swapped, all of the output signals SEi, SEi-l . . . lower than the value of X-address (X2, X1, X0) can be set on "H". In this way, it is possible to select the pixels of column 6 and lower columns b3,1, b3,2, b3,3, b3,4, b3,5, b3,6 for block Bi,j+1. FIG. 20 shows an example of the configuration of a selector circuit which can be used in column selector XSEL. The selector circuit in FIG. 20 is made of gate circuits.

Figure 21:
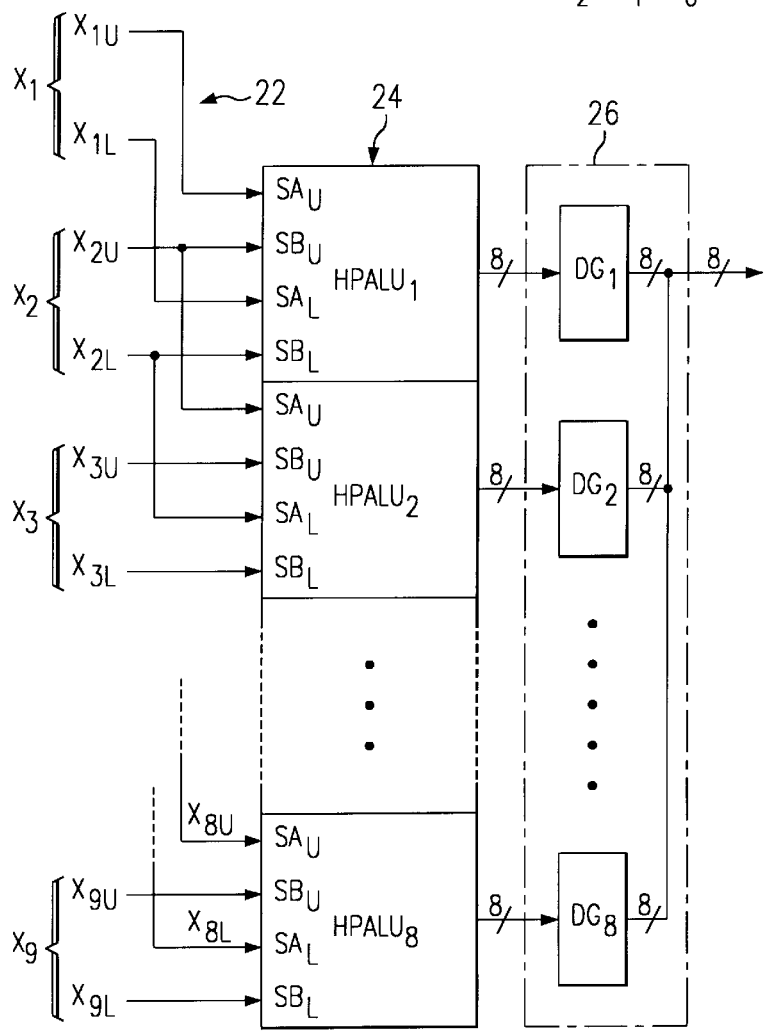
FIG. 21 illustrates the configuration of connection between the output terminal of column selector XSEL and the input terminal of the various operation units of half-pel operation circuit 24.

FIG. 21 illustrates the configuration of connection between output terminals x1, x2 . . . x9 of column selector XSEL and the input terminals of operation units HPALU1–HPALU8 of half-pel processing circuit 24. In this configuration, the upper bits x1u and x2u of output terminals x1, x2 of column selector XSEL are connected to upper bit input terminals SAU and SBU of first operation unit HPALU1, respectively. The lower bits x1L and x2L of output terminals x1, x2 are connected to lower bit input terminals SAL and SBL of first operation unit HPALU1, respectively. Upper bit x2u and lower bit x2L of output terminal x2 are also connected to upper bit input terminal SAU on one side and lower bit input terminal SAL on the other side of second operation unit HPALU2, respectively. The other upper bit input terminal SBU and lower bit input terminal SBL of second operation unit HPALU2 are connected to upper bit x3u and lower bit x3L of output terminal x3, respectively. In the same way, the other output terminals x4–x9, 2 bits for each of them, are connected to the input terminals of the other operation units HPALU3–HPALU8, respectively.

Figure 22:
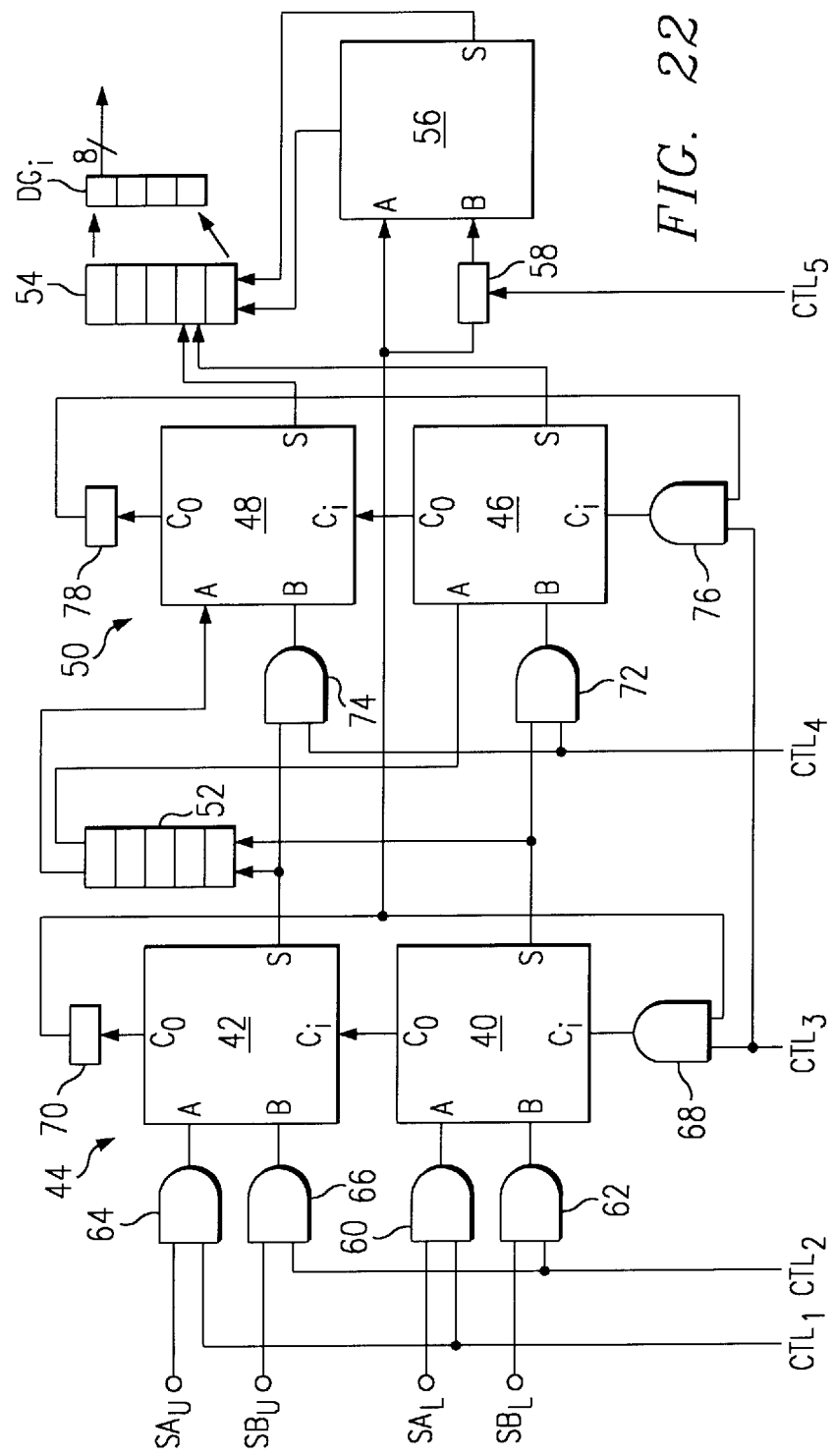
FIG. 22 is a circuit diagram illustrating the configuration of a circuit of the various operation units of half-pel operation circuit 24.

FIG. 22 shows an example of the configuration of the circuit of various operation units HPALUi. In this operation unit, first 2-position full adder circuit 44 made of a pair of half-adders 40, 42 and second full adder circuit 50 made of a pair of half-adders 46, 48 are connected to each other in series. Between these adder circuits 44, 50, there is a data register 52 with a size of 2×5 bits. In addition, the output terminal of second adder circuit 50 is connected to data register 54 with a size of 2×5 bits. While the carry output terminal CO of first adder circuit 44 is directly connected to one input terminal A of half-adder circuit 56, it is also connected to the other input terminal B of half-adder circuit 56 via a one-bit register 58.

In the following, we explain the operation of operation unit HPALUi with respect to the fourth read pattern shown in FIG. 16. As pointed out in the above, the read pattern corresponds to the case in which the pixels of the desired area AR are located at the middle point between the X-grids and Y-grids of the various blocks, that is, on the XY half-grids, respectively. In this case, half-pel processing is performed to derive the average value of the adjacent 4 pixels in both the X-direction and Y-direction. The derived average values are output as 8×8 pixel information in area AR. In the 8×8 output block shown in FIG. 16, for example, the average value pixel of the first column, first row is generated as (a3,6+a3,7+a4,6+a4,7)/4 in first operation unit HPALU1; for example, the average value pixel of the second column, first row is generated as (a3,7+a3,8+a4,7+a4,8)/4 in second operation unit HPALU2; and, for example, the average value pixel of the eighth column, first row is generated as (b3,5+b3,6+b4,5+b4,6)/4 in eighth operation unit HPALU8.

Figure 23:
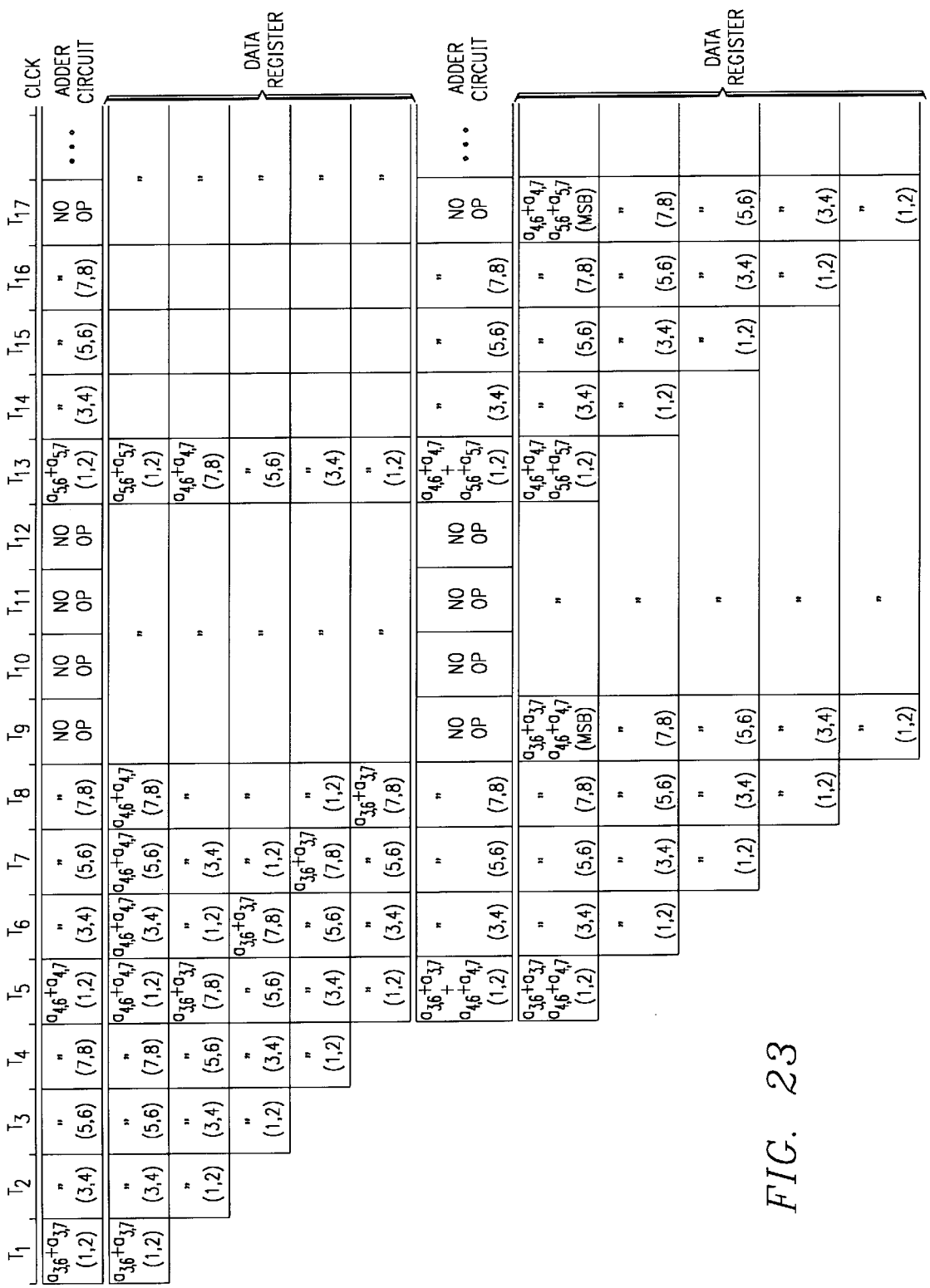
FIG. 23 is a timing diagram illustrating the operation of first operation unit HPALU1 of half-pel operation circuit 24 in the embodiment.

In the following, the operation of first operation unit HPALU1 will be explained with reference to FIGS. 22 and 23. In first clock cycle T1, lowest bits a3,6(1), a3,7(1) of pixels a3,6, a3,7 are input through AND gates 60, 62 to two input terminals A, B of half-adder 40 for lower bit of first adder circuit 44, respectively. Half-adder 40 adds these bits a3,6(1), a3,7(1), and outputs the sum from output terminal S. In the case when a carry is generated, the carry is output from carry output terminal CO. The sum is stored in data register 52, and the carry is sent to carry input terminal Ci of half-adder 42 for the upper bit. On the other hand, next lowest bits a3,6(2), a3,7(2) of pixels a3,6, a3,7 are input through AND gates 64, 66 to two input terminals A, B of half-adder 42 for upper bits, respectively. Half-adder 42 adds bits a3,6(2), a3,7(2) and any received carry bit, and outputs the sum from output terminal S. In the case when a carry is generated, the carry is output from carry output terminal CO. The sum is stored in data register 52, and the carry is stored in register 70. In the next cycle of the operation the carry is sent from this register 70 to carry input terminal Ci of half-adder 40 via AND gate 68.

In second clock cycle T2, third lowest bits a3,6(3), a3,7(3) of pixels a3,6, a3,7 are input through AND gates 60, 62 to two input terminals A, B of half-adder 40 for lower bits of first adder circuit 44, respectively. Half-adder 40 adds these bits a3,6(3), a3,7(3) and any carry from the preceding two lower bits a3,6 (1,2), a3,7 (1,2), and outputs the sum from output terminal S. In the case when a carry is generated, the carry is output from carry output terminal CO. The sum is stored in data register 52 in FIFO format, and the carry is sent to carry input terminal Ci of half-adder 42 for the upper bit. On the other hand, fourth lowest bits a3,6(4), a3,7(4) of pixels a3,6, a3,7 are input through AND gates 64, 66 to two input terminals A, B of half-adder 42 for upper bits, respectively. Half adder 42 adds these bits a3,6(4), a3,7(4) and any carry, and outputs the sum from output terminal S. In the case when a carry is generated, the carry is output from carry output terminal CO. The sum is stored in data register 52 in the FIFO format, and the carry is stored in register 70. In the next cycle of the operation, the carry is sent from this register 70 to carry input terminal Ci of half-adder 40 via AND gate 68.

In the same way as explained above, in cycle T3, the fifth bits counted from the lowest bit a3,6(5), a3,7(5) and the sixth bits counted from the lowest bit a3,6(6) and a3,7(6) of pixels a3,6, a3,7 are added respectively. In cycle T4, the seventh bits counted from the lowest bit a3,6(7), a3,7(7) and the eighth bits counted from the lowest bit (that is, the uppermost bits) 3,6(8) and a3,7(8) of pixels a3,6, a3,7 are added respectively. Consequently, the value of the sum of pixels a3,6, a3,7 (8 bits each) is stored in register 52 in FIFO format from the lowest bit, two bits at a time. Any carry output to register 70 in the addition operation of the last two bits is transferred to register 58 in the timing of carry control signal CTL5.

As explained above, the addition operation of the two adjacent pixels in the X-direction, a3,6, a3,7 is carried out in four cycles T1–T4. Then, among the 9×9 block corresponding to the read area AR, pixels a4,6, a4,7 in columns 1 and 2 in row 2 are input by means of column register XSEL into first operation unit HPALU1 in four cycles, with 2 bits per cycle, from the lowest bit.

First of all, in cycle T5, the addition operation is performed for the lowest bits a4,6(1), a4,7(1) of pixels a4,6, a4,7 at half-adder 40. At the same time, the addition operation is performed for the second lowest bits a4,6(2), a4,7(2) of pixels a4,6, a4,7 at half-adder 42. The sums of the two lower bits of pixels a4,6, a4,7, namely, (a4,6(1)+a4,7(1)); (a4,6(2)+a4,7(2)), output from said half-adders 40, 42 are stored in the FIFO format into data register 52. At the same time, through AND gates 72, 74, they are input to one input terminal B of half-adder circuits 46, 48 of second adder circuit 50.

The sum of the lowest bits of row-1 pixels a3,6, a3,7; (a3,6(1)+a3,7(1)), is sent from data register 52 to the other input terminal A of half-adder circuit 46. Half-adder circuit 46 performs the addition operation for the aforementioned two inputs a4,6(1)+a4,7(1); a3,6(1)+a3,7(1), and it sends the sum from output terminal S. When a carry is generated, it is output from carry output terminal CO. The value of the sum is loaded in data register 54 in the FIFO format. The carry is input into carry input terminal Ci of half-adder 48. The sum of the second lowest bits of row-1 pixels a3,6, a3,7; a3,6(2)+a3,7(2), is sent from data register 52 to the other input terminal A of half-adder circuit 48. Half-adder circuit 48 performs the addition operation for the aforementioned two inputs a4,6(2)+a4,7(2); a3,6(2)+a(3,7(2), and it sends the sum from output terminal S. When a carry is generated, it is output from carry output terminal CO. The value of the sum is loaded in data register 54 in the FIFO format. The carry is input into carry input register 78. In the next cycle, the carry is sent from this register 78 to carry input terminal Ci of half-adder 46 via AND gate 76.

In the next cycle T6, first adder circuit 44 performs the addition operation of the third bits counted from the lowest bit a4,6(3), a4,6(3) and the fourth bits counted from the lowest bit a4,6(4), a4,6(4) of pixels a4,6, a4,7 in the second row, respectively. In the second adder circuit 50, the sum of the third bits counted from the lowest bit a3,6(3). a3,7(3) and the sum of the fourth bits counted from the lowest bit a3,6(4), a3,7(4) of the row-1 pixels a3,6, a3,7 from data register 52 are added, respectively, to the sum of the third bits counted from the lowest bit a4,6(3). a4,7(3) and the sum of the fourth bits counted from the lowest bit a4,6(4), a4,7(4) of the row-2 pixels a4,6, a4,7 obtained in the first adder circuit 44. The sum of the third and fourth bits counted from the lowest bit of the four pixels a3,6, a3,7, a4,6, a4,7 obtained from second adder circuit 50 is loaded in the FIFO format to data register 54.

In a similar way, by means of second adder circuit 50, in cycle T7, the sum of the fifth and sixth bits counted from the lowest bit of the four pixels a3,6, a3,7, a4,6, a4,7 is derived. In cycle T8, a sum of the seventh and eighth bits counted from the lowest bit of the four pixels a3,6, a3,7, a4,6, a4,7 is derived. These sums are loaded successively in data register 54. In cycle T8. the carry generated by half-adder 42 for the upper bit of first adder circuit 44 is input to input terminal A of half-adder 56, and it is also loaded into register 58. In this case, the carry of the sum of pixels a3,6, a3,7 loaded in the preceding cycle T4 is kept on the output side of register 58. In the next cycle T9, half-adder 56 adds the carry of the sum of pixels a3,6, a3,7 and the carry of the addition result of pixels a4,6, a4,7, and the sum and carry obtained are loaded in data register 54. As a result, the sum (10 bits) of the four pixels a3,6, a3,7, a4,6, a4,7, which surround the upper-left half-grid of assigned read area AR is stored in data register 54. By shifting the data in data register 54 by two bits, the sum is divided by 4, and the average value pixel (a3,6+a3,7+a4,6+a4,7)/4 is derived. This average value pixel's datum is sent to first register DG1 of data register 26.

When cycle T13 is reached after a prescribed time, pixels a5,6, a5,7 in columns 1 and 2 in row 3 in the 9×9 working block corresponding to read area AR are input by means of column selector XSEL into first operation unit HPALU1, in 4 cycles, with 2 bits per cycle. First adder circuit 44 then performs the same operation as above, and these pixels a5,6, a5,7 are added from the lowest bit in 4 cycles T13–T16, with 2 bits per cycle. On the other hand, in second adder circuit 50, the same operation as above is also performed, and the sum of these pixels a5,6, a5,7 and the sum of pixels a4,6, a4,7 stored in data register 52 are added from the lowest bit in 4 cycles T13–T16, with 2 bits per cycle. Then, in cycle T17, half-adder 56 adds the carry of the sum of pixel a4,6, a4,7 and the carry of the sum of pixels a5,6, a5,7, and the sum (10 bits) of the four pixels a4,6, a4,7, a5,6, a5,7, which surround the half-grid on row 2 and column 1 in assigned read area AR is stored in data register 54, and the average value pixel (a4,6+a4,7+a5,6+a5,7)/4 is sent from said data register 54 to first register DG1 of data register 26.

Figure 24:
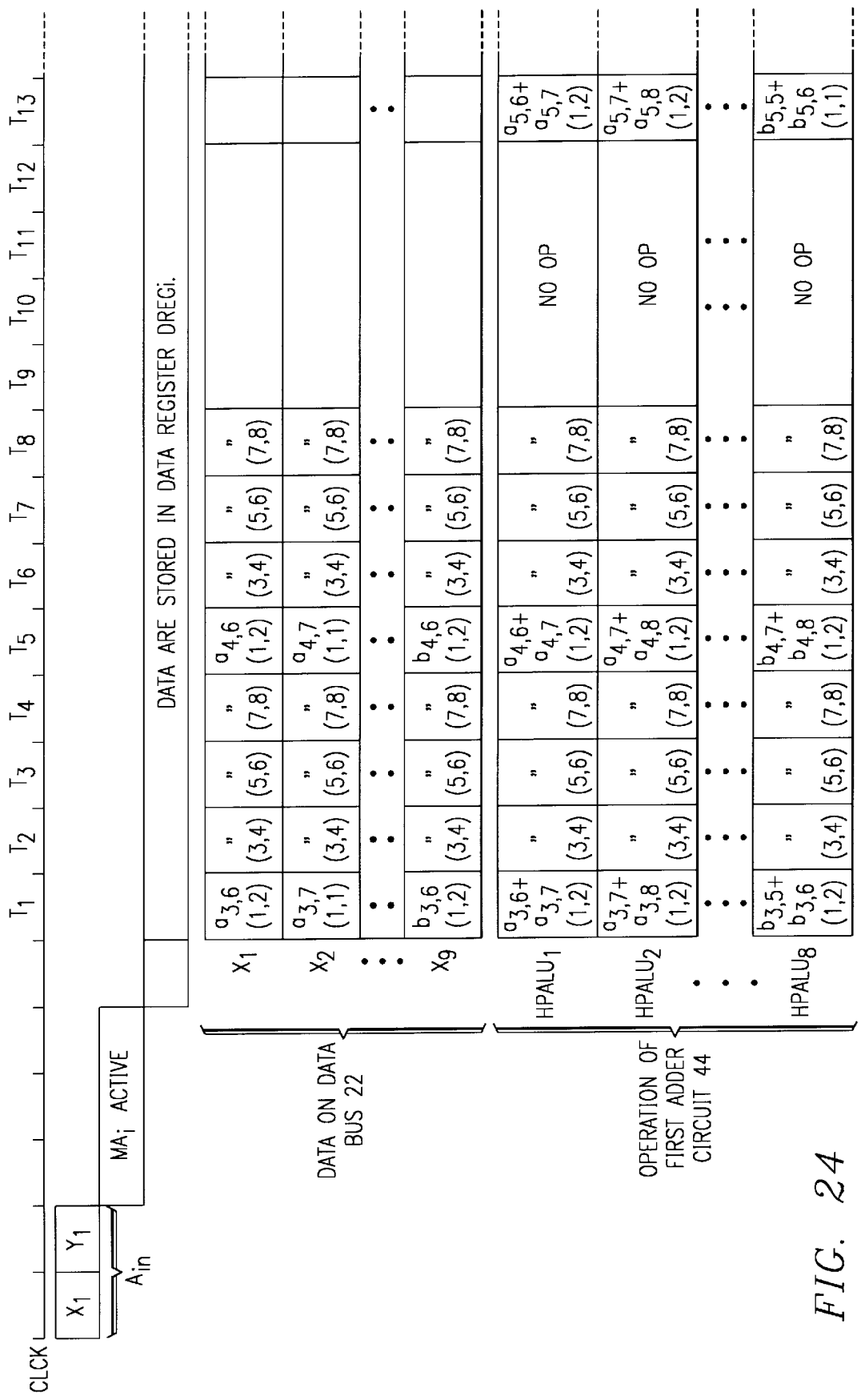
FIG. 24 is a timing diagram illustrating the state of the parallel operation of the first through eighth operation units HPALU1–HPALU8 of half-pel circuit 24 in the embodiment.
Figure 25:
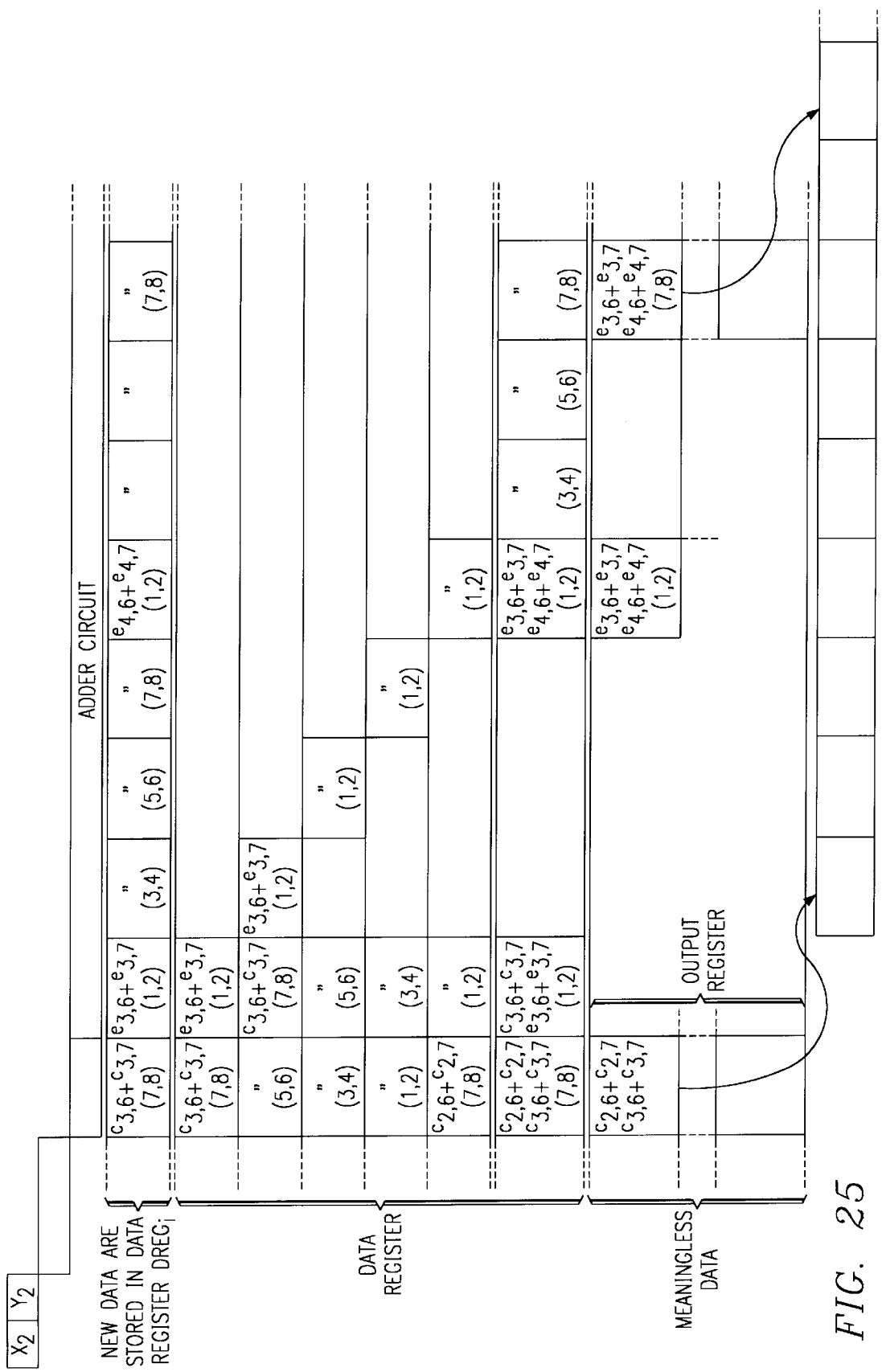
FIG. 25 is a timing diagram illustrating the operation of the operation unit when the read operation of one assigned read area is switched to the read operation of another assigned read area.
Figure 26:
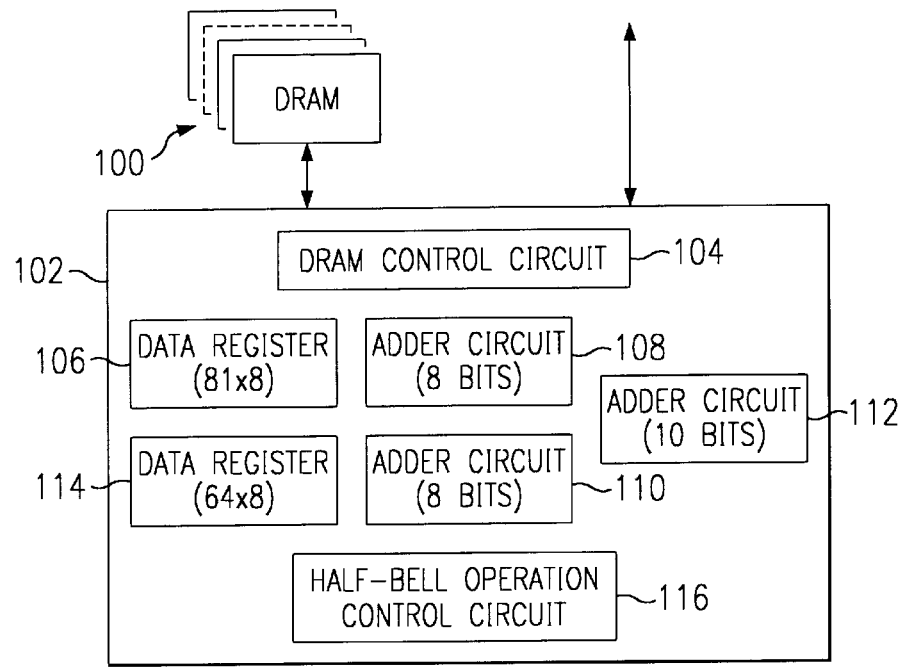
FIG. 26 is a block diagram illustrating the configuration of the conventional image memory for MPEG.
Figure 27:
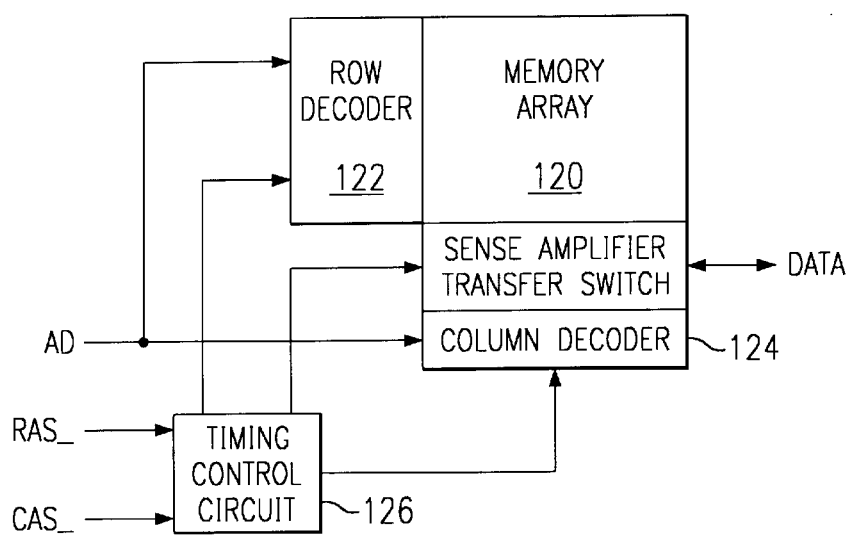
FIG. 27 illustrates a typical configuration of DRAM used for the conventional image memory.

In the above, the operation of the first operation unit HPALU1 has been explained. The other operation units HPALU2–HPALU8 also perform (parallel) operations with the first operation unit HPALU1, and generate the average value pixels of columns 2–8 in the respective 8×8 output blocks. FIG. 24 illustrates the state of the parallel operation of the eight operation units HPALU1–HPALU8 in half-pel operation circuit 24. FIG. 25 shows the state in which, soon after 8×8 pixels are output for an assigned read area AR, the processing for the next assigned read area AR is started at the various operation units HPALUi. From data register 26, eight average value pixels are output continuously in order from first register DG1 to the eighth register DG8 in eight cycles, with a rate of 1 average value pixel (8 bits)/1 cycle, to data output buffer 28. After one cycle of this operation, the same transfer operation is repeated, and the next eight row of average value pixels are output continuously without any interruption. In the operation unit shown in FIG. 22, control signals CTL1, CTL2, CTL4 are set selectively on levels of "H" and "L" corresponding to YES/NO of requirement on the half-pel processing. For example, for the first read pattern in FIG. 13, CTL1 is on "H," while CTL2 and CTL4 are on "L"; for the second read pattern shown in FIG. 14, CTL1 and CTL2 are on "H", while CTL4 is on "L;" for the third read pattern shown in FIG. 15, CTL1 and CTL4 are on "H," while CTL2 is on "L;" and for the fourth read pattern shown in FIG. 16, CTL1, CTL2, and CTL4 are on "H".

In this way, in the image memory in this embodiment, when the image information of the read area AR assigned at an arbitrary site is read out by 8×8 size, the image information of the various blocks Bi,j are read together to data registers DREGi from 1–4 independent memory arrays related to the aforementioned area; the desired pixels are sent first from data registers DREGi in the pipeline format, two bits at a time, to various operation units HPALUi of half-pel operation circuit 24; at various operation units HPALUi, the two input pixels are added, two bits at a time, from the lowest bit; at the same time, the sum is added to the two bits corresponding to the sum of the two pixels of the preceding row. In this way, in four cycles, the four 8-bit pixels are added and averaged, and the average value pixels are output without interruption in each cycle. Consequently, even when the clock cycle is selected as 35 nsec, there is still a significant margin for making the half-pel processing for the 9×9 pixels and outputting as 8×8 pixels.

In the aforementioned embodiment, eight memory arrays MA1–MA8 are used. However, this number is not a necessity. For example, it is also possible to use four memory arrays MA1–MA4. The main point required in this invention is that it has a configuration which allows allocation of multiple, for example, 80×60, blocks to multiple memory arrays so that all of the blocks adjacent to an arbitrary block can be stored in corresponding memory arrays different from that of the aforementioned arbitrary block. The image memory of this invention may also be used in applications other than MPEG. For example, it is possible to perform the write operation in units of 1 row instead of 8×8 blocks, and to perform the read operation from any site in size of 8×8 as above. In the aforementioned embodiment, the various operation units of the half-pel operation circuit have a configuration corresponding to addition from the lowest bit with 2 bits at a time. However, it may also have a configuration in which the addition operation is carried out from the lowest bit, with 4 bits at a time.

As explained in the above, in this invention, multiple blocks are allocated to multiple memory arrays so that all of the blocks adjacent to an arbitrary block are stored in the corresponding memory arrays different from the aforementioned arbitrary block; when the read area is assigned at any site and with the same size as that of the block, the image information is read simultaneously from the adjacent blocks at least partially overlapped with the aforementioned area; then, the half-pel processing is carried out so as to extract the necessary image information corresponding to the assigned read area from the read image information; in this way, the desired pixels can be output at a high rate. In the half-pel processing method of this invention, the operation is carried out using a pipeline format; hence, the desired pixels can be output without interruption. Consequently, this invention can also be used for MPEG and other specifications with sufficient margin.

We claim:

1. A pipeline image processor for a digital image in the form of a matrix of blocks, each block having a grid of pixels in a predetermined number of rows and columns, midpoints between pixels being referenced to an imaginary half-grid, comprising:

an address input terminal for receiving an image address signal indicating a desired block AR of computed pixels on the half-grid;

a plurality of memory arrays, simultaneously readable a block at a time, for storing the digital image by blocks so that any four adjacent blocks forming a square in the digital image are stored in different memory arrays;

a memory control circuit responsive to the image address signal for simultaneously reading from the memory arrays each block of pixels of the digital image required for computing the desired block AR;

a pixel selector circuit responsive to the image address signal for sequentially outputting from such required blocks by row, just those pixels of adjacent blocks required for computing the desired block, as a row of working pixels; and a half-pel operation circuit for (i) simultaneously averaging, a row at a time, horizontally adjacent pairs of the working pixels, (ii) storing the results in an internal register as a corresponding current row of horizontally-averaged pixels, and then (iii) averaging, a row at a time, each pixel of the current row of horizontally-averaged pixels with a corresponding pixel of a just prior row of horizontally-averaged pixels stored in the internal register, to output a row of computed pixels of the desired block AR on the half-grid.

2. The image processor of claim 1 further comprising:

a data input terminal for receiving pixel data a block at a time;

wherein the memory control circuit is responsive to the data input terminal for writing the pixel data to the memory arrays a block at a time so that any four adjacent blocks forming a square in the digital image are stored in different memory arrays.

3. The image processor of claim 1 wherein:

the memory control circuit comprises, for each memory array, a corresponding data register for receiving and holding a block of pixels from the memory array required for computing the desired block AR; and the pixel selector circuit comprises, for each data register, a corresponding row selector responsive to the image address signal for sequentially outputting each row of the block held in the data register required for computing the desired block AR.

4. The image processor of claim 3 wherein the pixel selector circuit further comprises a common column selector responsive to the image address signal for selecting, by row from each row output by the row selectors, just those pixels required for computing the desired block AR, as a row of working pixels.

5. The image processor of claim 1 wherein the half-pel operation circuit has a half-pel operation unit for each column of the block, each comprising:

a horizontal adder for averaging a horizontally adjacent pair of the working pixels as a current horizontally-averaged pixel;

an internal pixel register for storing the current horizontally-averaged pixel; and a vertical adder for averaging the current horizontally-averaged pixel with a just prior horizontally-averaged pixel stored in the internal pixel register, to output a computed pixel of the desired block AR on the half-grid.

6. A method of pipeline image processing a digital image in the form of a matrix of blocks, each block having a grid of pixels in a predetermined number of rows and columns, to compute averaged midpoints between pixels on an imaginary half-grid, comprising the steps of:

providing a plurality of memory arrays, simultaneously readable a block at a time, for storing the digital image;

storing the digital image in the memory arrays by blocks so that any four adjacent blocks forming a square in the digital image are stored in different memory arrays;

providing an image address signal indicating a desired block AR of computed pixels on the half-grid;

responsive to the image address signal, simultaneously reading from the memory arrays each block of pixels of the digital image required for computing the desired block AR;

responsive to the image address signal, sequentially outputting from such required blocks of pixels by row, just those pixels of adjacent blocks required for computing the desired block, as a row of working pixels;

simultaneously averaging, a row at a time, horizontally adjacent pairs of the working pixels to form a corresponding current row of horizontally-averaged pixels; and averaging, a row at a time, each pixel of the current row of horizontally-averaged pixels with a corresponding pixel of a just prior row of horizontally-averaged pixels to output a row of computed pixels of the desired block AR on the half-grid.

7. The method of claim 6 further comprising the steps of:

providing a corresponding data register for each memory array;

receiving and holding a block of pixels in each data register read from its corresponding memory array that is required for computing the desired block AR;

providing a corresponding row selector for each data register; and responsive to the image address signal, sequentially outputting by each row selector from the block held in the corresponding data register each row required for computing the desired block AR.

8. The method of claim 7 further comprising the steps of:

providing a common column selector; and responsive to the image address signal, selecting, by row from each row output by the row selectors, just those pixels required for computing the desired block AR, as a row of working pixels.

9. The method of claim 6 further comprising for each column of the block the steps of:

providing an internal pixel register;

averaging a corresponding horizontally adjacent pair of the working pixels as a current horizontally-averaged pixel;

storing the current horizontally-averaged pixel in the internal pixel register; and averaging the current horizontally-averaged pixel with a just prior horizontally-averaged pixel stored in the internal pixel register, to output a corresponding computed pixel of the desired block AR on the half-grid.

10. A pipeline image processor for a digital image in the form of a matrix of blocks, each block having a grid of pixels in a predetermined number of rows and columns, midpoints between pixels being referenced to an imaginary half-grid, comprising:

an address input terminal for receiving an image address signal indicating a desired block AR of computed pixels on the half-grid, each desired block AR having a grid of pixels in a predetermined number of rows and columns;

a plurality of memory arrays, for storing the digital image by blocks so that any four adjacent blocks forming a square in the digital image are stored in different memory arrays;

a memory control circuit responsive to the image address signal for simultaneously reading from the memory arrays each block of pixels of the digital image required for computing the desired block AR;

a pixel selector circuit responsive to the image address signal for outputting from such required blocks by row, just those pixels of adjacent blocks required for computing the desired block, as a row of working pixels; and processing circuitry connected to receive the row of working pixels for simultaneously operating on each pixel of the row of working pixels to output a row of computed pixels of the desired block AR.

11. The image processor of claim 10, wherein the processing circuitry comprises a plurality of half-pel operation circuits for (i) simultaneously averaging, a row at a time, horizontally adjacent pairs of the working pixels to form a current row of horizontally-averaged pixels, and then (ii) averaging, a row at a time, each pixel of the current row of horizontally-averaged pixels with a corresponding pixel of a just prior row of horizontally-averaged pixels to output a row of computed pixels of the desired block AR on the half-grid.

12. The image processor of claim 11 wherein each half-pel operation circuit has a half-pel operation unit for each column of the desired block AR, each comprising:

a horizontal adder for averaging a horizontally adjacent pair of the working pixels as a current horizontally-averaged pixel; and a vertical adder for averaging the current horizontally-averaged pixel with a just prior horizontally-averaged pixel, to output a computed pixel of the desired block AR on the half-grid.

13. The image processor of claim 11 wherein each half-pel operation circuit has a half-pel operation unit for each column of the desired block AR, each comprising:

a horizontal adder for averaging a horizontally adjacent pair of the working pixels as a current horizontally-averaged pixel;

an internal pixel register for storing the current horizontally-averaged pixel; and a vertical adder for averaging the current horizontally-averaged pixel with a just prior horizontally-averaged pixel stored in the internal pixel register, to output a computed pixel of the desired block AR on the half-grid.

* * * * *